(12) United States Patent
Watanabe et al.

(10) Patent No.: US 8,786,089 B2
(45) Date of Patent: Jul. 22, 2014

(54) MANUFACTURING METHOD OF SEMICONDUCTOR DEVICE, SEMICONDUCTOR DEVICE AND ELECTRONIC APPARATUS

(75) Inventors: Kazuto Watanabe, Kumamoto (JP); Atsushi Matsushita, Kumamoto (JP); Hiroshi Horikoshi, Kumamoto (JP); Iwao Sugiura, Kumamoto (JP); Yuuji Nishimura, Kumamoto (JP); Syota Yamabata, Kumamoto (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 13/359,075

(22) Filed: Jan. 26, 2012

(65) Prior Publication Data
US 2012/0211879 A1 Aug. 23, 2012

(30) Foreign Application Priority Data

Feb. 23, 2011 (JP) .................................. 2011-036638

(51) Int. Cl.
*H01L 23/48* (2006.01)
(52) U.S. Cl.
USPC ............ 257/762; 257/E21.482; 257/E33.062; 438/617
(58) Field of Classification Search
CPC ................................................ H01L 21/76841
USPC ........... 438/617, 799; 257/E21.482, E33.062, 257/748, 762
See application file for complete search history.

(56) References Cited

U.S. PATENT DOCUMENTS

| 6,358,849 B1* | 3/2002 | Havemann et al. ........... 438/689 |
| 2002/0155702 A1* | 10/2002 | Aoki et al. ..................... 438/653 |
| 2003/0183510 A1* | 10/2003 | Hu ........................... 204/192.17 |
| 2003/0214043 A1* | 11/2003 | Saitoh et al. .................. 257/758 |
| 2006/0118795 A1* | 6/2006 | Araki ............................... 257/83 |
| 2007/0026574 A1* | 2/2007 | Beatson et al. ............... 438/123 |
| 2007/0164442 A1* | 7/2007 | McTeer ......................... 257/762 |
| 2008/0311739 A1* | 12/2008 | Besling et al. ................ 438/643 |
| 2009/0243105 A1* | 10/2009 | Lehr et al. ..................... 257/751 |
| 2011/0298134 A1* | 12/2011 | Williams et al. .............. 257/751 |

FOREIGN PATENT DOCUMENTS

JP   2006-253422   9/2006

\* cited by examiner

*Primary Examiner* — Caridad Everhart
(74) *Attorney, Agent, or Firm* — Rader, Fishman & Grauer PLLC

(57) ABSTRACT

A manufacturing method of a semiconductor device includes exposing a wiring layer which is formed of an alloy including two or more types of metals having different standard electrode potentials, on one surface side of a semiconductor substrate and performing a plasma process of allowing plasma generated by a mixture gas of a gas including nitrogen and an inert gas or plasma generated by a gas including nitrogen to irradiate a range which includes an exposed surface of the wiring layer.

8 Claims, 15 Drawing Sheets

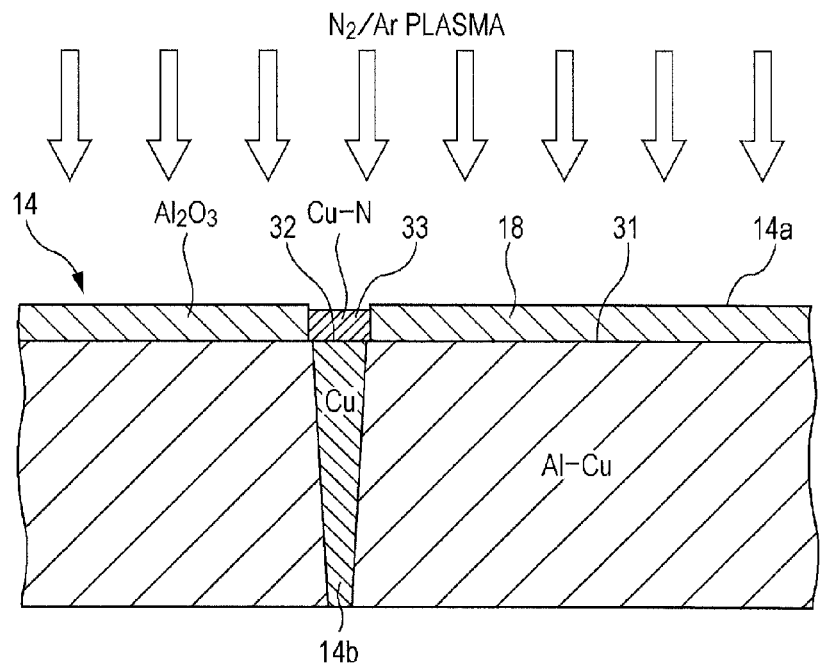
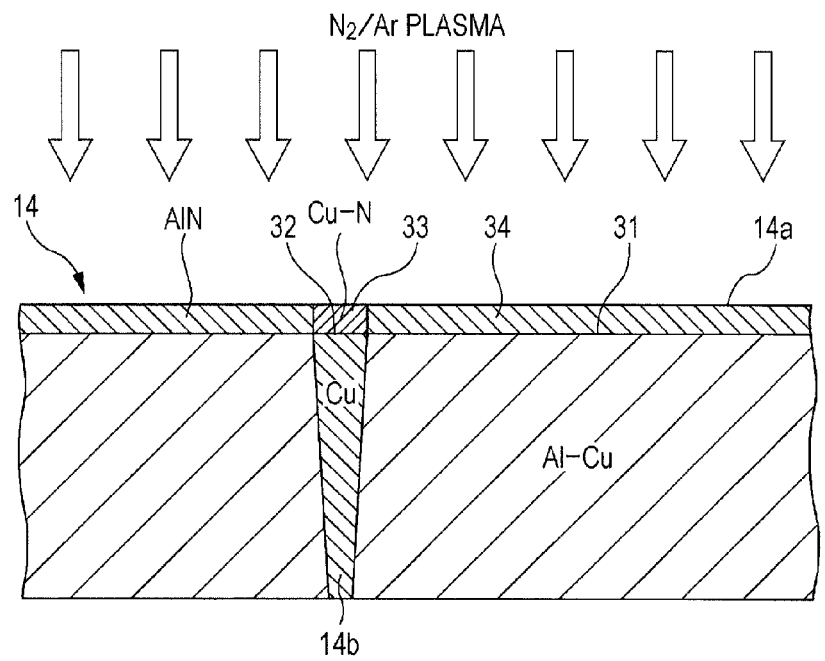

FIG. 14
FIG. 14A
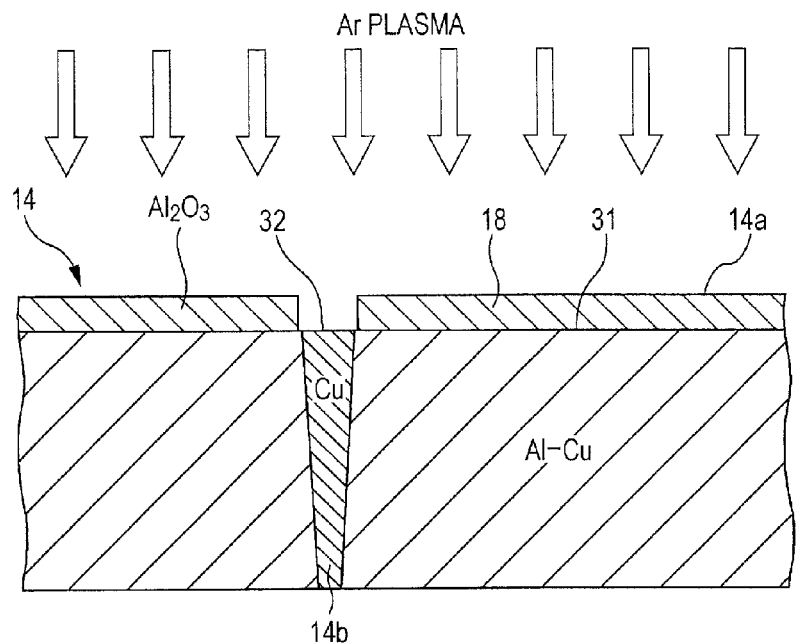
FIG. 14B
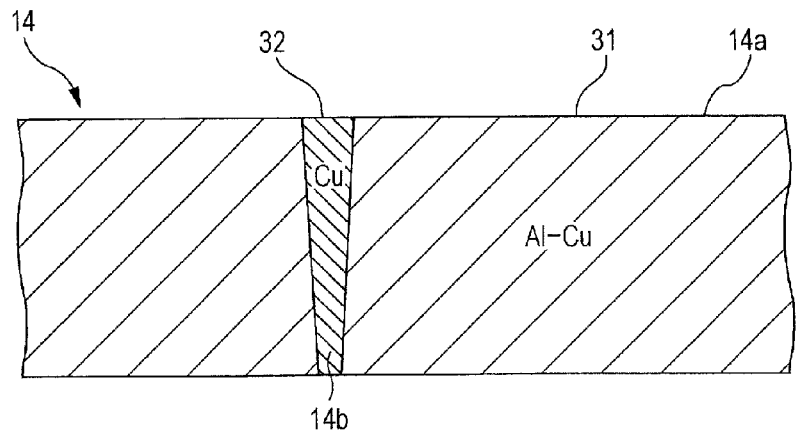

MANUFACTURING METHOD OF SEMICONDUCTOR DEVICE, SEMICONDUCTOR DEVICE AND ELECTRONIC APPARATUS

BACKGROUND

The present disclosure relates to a manufacturing method of a semiconductor device, the semiconductor device and an electronic apparatus.

A semiconductor device such as an image sensor (solid-state imaging device) of a CCD (Charge Coupled Device) type or a CMOS (Complementary Metal Oxide Semiconductor) type has an electrode pad as a part of a wiring layer. The electrode pad of the semiconductor device is electrically connected with a lead frame from which a lead wire is extended, or the like, for example. In order to electrically connect the electrode pad with respect to the lead frame or the like, a metallic wire is connected to the electrode pad by wire bonding, or a bump which is a protruding section made of solder or the like is formed on the electrode pad.

The electrode pad of the semiconductor device is formed in a preparatory process which is called a wafer process, in a manufacturing process of the semiconductor device. The electrode pad is exposed to the outside by removing, from a state where the electrode pad and a stacked film such as a passivation film for protection or a planarization film which covers the electrode pad are formed on a semiconductor substrate (wafer) made of silicon (Si), for example, the stacked film on the electrode pad. The stacked film on the electrode pad is removed by a dry etching process using etching gas or the like, for example, and an opening section which exposes the electrode pad is formed as a portion in which the stacked film is removed.

Further, in a post process after the preparatory process including the process of forming the electrode pad, the electric connection with the electrode pad is performed by wire bonding or the like. In the post process, before the electric connection process is performed by wire bonding, a wafer test through a test measurement (probing) using a probe needle or the like and a dicing process of cutting and separating a wafer into a plurality of chips are performed.

In the dicing process, the wafer is cut by a disk-shaped diamond blade which rotates at high speed, for example, while cooling water is being applied thereto.

In the semiconductor device manufactured through the above-described processes, in order to enhance reliability of electric and mechanical connection of the electrode pad, it is important to secure the bonding strength of the electrode pad. In the related art, in order to secure the bonding strength of the electrode pad, a variety of solutions have been proposed. For example, Japanese Unexamined Patent Application Publication No. 2006-253422 discloses a technique in which an electrode pad is formed as a stacked layer to enhance the bonding strength, considering that if the film thickness of the electrode pad is thin, the mechanical strength of the electrode pad becomes weak and the bonding strength is thus decreased.

SUMMARY

However, in the semiconductor device, as one of the causes of the bonding strength decrease of the electrode pad, there is a problem in that corrosion is generated in the electrode pad as water is in contact with the electrode pad. When the dicing process is performed in the post process as described above, the electrode pad is in contact with water by being applied with water (pure water) which is used as cooling water. When the electrode pad is in contact with the water, metal which forms the electrode pad is ionized due to electrolysis of the water. This phenomenon is called galvanic corrosion.

Specifically, for example, in a case where the electrode pad is made of an alloy (AlCu) of aluminum (Al) and copper (Cu), if the electrode pad is in contact with water, Al is ionized and an Al ion is eluted. The eluted Al ion reacts with the water and is combined with a cutting scrap (silicon scrap) or the like of the wafer generated in the dicing process, for example, to thereby become an attachment to the front surface of the electrode pad. This attachment is covered with aluminum hydroxide which is generated as Al reacts with water and is firmly attached to the front surface of the electrode pad. Due to this attachment on the electrode pad, abnormal corrosion occurs in which the attachment is attached around a corrosion portion due to the galvanic corrosion on the front surface of the electrode pad.

In this way, the corrosion using the galvanic corrosion as the starting point is generated on the front surface of the electrode pad. The corrosion generated on the front surface of the electrode pad reduces an effective contact area which is a bonding surface between the electrode pad and a wiring such as a metallic wire connected with the electrode pad, which causes poor connection such as decrease in mechanical bonding strength or poor electric contact. Further, the pad corrosion generated on the front surface of the electrode pad causes an inferior appearance. Further, the poor connection in the electrode pad causes complaints of a user in view of reliability.

Accordingly, it is desirable to provide a manufacturing method of a semiconductor device, the semiconductor device and an electronic apparatus which are capable of suppressing generation of corrosion which is generated on an exposed surface of a wiring layer due to contact with water in a dicing process or the like and causes reduction in the bonding strength on the exposed surface of the wiring layer, an inferior appearance, or the like.

According to an embodiment of the present disclosure, there is provided a manufacturing method of a semiconductor device, the method including exposing a wiring layer which is formed of an alloy including two or more types of metals having different standard electrode potentials, on one surface side of a semiconductor substrate and performing a plasma process of allowing plasma generated by a mixture gas of a gas including nitrogen and an inert gas or plasma generated by a gas including nitrogen to irradiate a range which includes an exposed surface of the wiring layer.

In the above manufacturing method of the semiconductor device of the present disclosure, a passive layer may be generated on the exposed surface in the exposing the wiring layer, and the method may further include removing the passive layer between the exposure of the wiring layer and the performing the plasma process.

In the above manufacturing method of the semiconductor device of the present disclosure, the gas including nitrogen may include at least one of nitrogen, ammonia and nitrogen trifluoride, and the inert gas may include at least one of argon, xenon, helium and neon.

In the above manufacturing method of the semiconductor device of the present disclosure, the wiring layer may include an electrode pad having a connection surface for electric connection as the exposed surface.

The above manufacturing method of the semiconductor device of the present disclosure may further include performing a dicing process of cutting and separating the semiconductor substrate into a plurality of chips, after performing the plasma process.

According to another embodiment of the present disclosure, there is provided a manufacturing method of a semiconductor device, the method including performing a predetermined process of generating a contact section in which two or more types of metals having different standard electrode potentials are in contact with each other, on one surface side of a semiconductor substrate and performing a plasma process of allowing plasma generated by a mixture gas of a gas including nitrogen and an inert gas or plasma generated by a gas including nitrogen to irradiate a range which includes the contact section.

According to still another embodiment of the present disclosure, there is provided a semiconductor device including a semiconductor substrate, a wiring layer which is formed of an alloy including two or more types of metals having different standard electrode potentials, on one surface side of a semiconductor substrate, and a nitride layer which is formed, as the wiring layer is irradiated by plasma generated by a mixture gas of a gas including nitrogen and an inert gas or plasma generated by a gas including nitrogen, on a front layer of a surface of the wiring layer irradiated by the plasma.

In the above semiconductor device of the present disclosure, the nitride layer may be formed on a front layer of a metal portion having a relatively high standard electrode potential among the two or more metals, and the semiconductor device may further include a passive layer formed as the front layer of the wiring layer is passivated.

According to still another embodiment of the present disclosure, there is provided an electronic apparatus including the above semiconductor device, and a drive section which generates a drive signal for driving the semiconductor device.

According to the embodiments of the present disclosure, it is possible to suppress generation of corrosion which is generated on the exposed surface of the wiring layer as water is in contact with the exposed surface of the wiring layer in a dicing process or the like and causes reduction in the bonding strength on the exposed surface of the wiring layer, an inferior appearance, or the like.

BRIEF DESCRIPTION OF THE DRAWINGS

FIG. 8 is a partially enlarged cross-sectional view illustrating a state of a manufacturing process of a solid-state imaging device according to an embodiment of the present disclosure;

FIG. 9 is a partially enlarged cross-sectional view illustrating a configuration of a solid-state imaging device according to an embodiment of the present disclosure;

FIG. 14 is a diagram illustrating a manufacturing method according to an embodiment of the present disclosure;

DETAILED DESCRIPTION OF EMBODIMENTS

Figure 1:
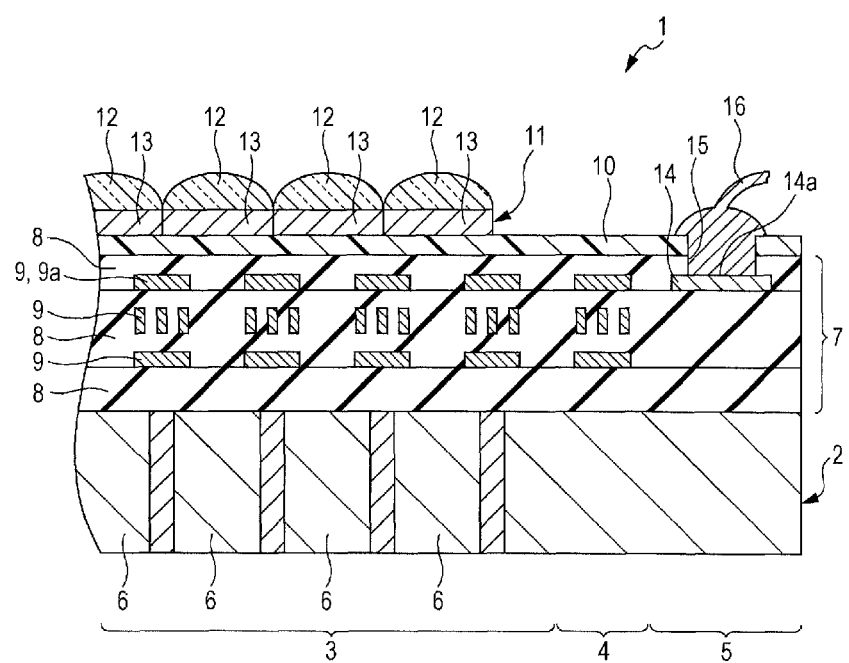
FIG. 1 is a cross-sectional view illustrating a configuration of a solid-state imaging device according to an embodiment of the present disclosure.

The present disclosure uses the fact that in a configuration in which a wiring layer such as an electrode pad is formed of an alloy including two or more types of metals having different standard electrode potentials, such as AlCu, corrosion is generated on a front surface of the wiring layer due to a galvanic effect generated as water is in contact with the wiring layer which is exposed in a dicing process or the like.

Here, the galvanic effect is a phenomenon in which, in a case where dissimilar metals are present together in a conductive liquid in an alloy state or a contacted state, one metal discharges an electron to be ionized and is dissolved in a solution by difference between standard electrode potentials, and the electron is supplied to the other metal through the solution. For example, in a case where the wiring layer is in contact with water as described above, metal having a low standard electrode potential (relatively "coarse" metal) is oxidized and dissolved in water, electrons generated in the dissolution are combined (reduced) with hydrogen ions in the conductive liquid to thereby generate hydrogen. Specifically, when the metal having the low standard electrode potential is Al, the following reaction is generated.

$$Al \rightarrow Al^{3+} + 3e^- \text{(oxidation)}$$

$$H_2O + CO_2 \rightarrow H^+ + HCO_3^- \text{(ionization of conductive solution)}$$

$$2H^+ + 2e^- \rightarrow H_2 \text{(reduction)}$$

In order to suppress the corrosion generated on the front surface of the wiring layer due to the galvanic effect as mentioned above, the present disclosure includes a process of allowing plasma generated by a predetermined mixture gas to irradiate a range including the exposed surface of the wiring layer after a process of exposing the wiring layer such as an electrode pad in a semiconductor manufacturing process.

In the present disclosure, as the mixture gas which forms the plasma, a mixture gas of a gas including nitrogen and an inert gas or a gas including nitrogen is used. Here, as the gas including nitrogen, nitrogen ($N_2$), ammonia ($NH_3$), nitrogen trifluoride ($NF_3$) or the like is used. Further, as the inert gas, argon (Ar), xenon (Xe), helium (He), neon (Ne) or the like is used. Accordingly, the plasma used in the present disclosure is $N_2$/Ar plasma generated by the mixture gas of nitrogen and argon or $N_2$ plasma generated by nitrogen gas, for example.

In this way, by allowing the plasma to irradiate the range which includes the exposed surface of the wiring layer such as an electrode pad, it is possible to prevent the galvanic effect on the exposed surface of the wiring layer by a nitriding action due to plasma, and to suppress the corrosion generated on the front surface of the wiring layer. Further, the galvanic effect is also generated in a portion in which dissimilar metals are in contact with each other, as described above. Thus, the present disclosure includes a contact section of metals having different standard electrode potentials as a plasma irradiation target, in addition to the alloy including metals having different electrode potential.

Hereinafter, embodiments of the present disclosure will be described. In description of the embodiments, a CMOS image sensor will be used as a semiconductor device. However, the present disclosure may be broadly applied to a different solid-state imaging device such as a CCD image sensor or a different semiconductor device such as a semiconductor integrated circuit.

[Configuration of Solid-State Imaging Device]

A solid-state imaging device 1 according to an embodiment of the present disclosure will be described with reference to FIG. 1. As shown in FIG. 1, the solid-state imaging device 1 includes a semiconductor substrate 2 which is a wafer formed by semiconductor such as silicon. The solid-state imaging device 1 includes an imaging area 3, a peripheral circuit area 4, and an external connection area 5, when seen from a planar view of the semiconductor substrate 2.

The imaging area 3 is a rectangular area and includes a plurality of unit pixels 6 which are arranged in a matrix form from a planar view. That is, the plurality of unit pixels 6 are arranged in a 2-dimensional matrix form in the longitudinal direction (vertical direction) and the transverse direction (horizontal direction) over the rectangular imaging area 3. The unit pixels 6 are formed on the semiconductor substrate 2.

Each unit pixel 6 includes a photodiode which is a light receiving device having a photoelectric conversion function, and a plurality of MOS transistors. The photodiode which forms the unit pixel 6 has a light receiving surface and generates signal charges of an amount according to the amount (intensity) of light incident on the light receiving surface. The unit pixel 6 includes transistors which respectively perform amplification, selection and resetting of the signal charges generated by the photodiode, as the plurality of MOS transistors.

The peripheral circuit area 4 is formed around the imaging area 3. Although not shown, a vertical scanning circuit, a horizontal scanning circuit and the like for selecting pixels in the respective vertical and horizontal directions are arranged on the peripheral circuit area 4.

A stacked wiring layer 7 is formed on the semiconductor substrate 2. The stacked wiring layer 7 includes a plurality of interlayer insulation films 8 and a plurality of wiring layers 9. The interlayer insulation film 8 is formed by a silicon oxide film which is formed of silicon dioxide ($SiO2$), for example. The plurality of wiring layers 9 are formed of different metals, for example, and are connected with each other through a plug or the like formed between the layers.

Further, in the imaging area 3, a passivation film 10 for protection is formed on the stacked wiring layer 7. The passivation film 10 is a planarization film and has light transmissive characteristics. A color filter layer 11 is formed on the passivation film 10. A plurality of microlenses 12 are formed on the color filter layer 11.

The color filter layer 11 is divided into a plurality of color filters 13 for the respective photodiodes which form the unit pixels 6. Each color filter 13 is a color filter section of any one of red, green and blue, for example, and transmits light of each color component. Each color filter 13 is formed in a predetermined array such as a so-called Bayer array.

The microlens 12 is formed for each unit pixel 6 corresponding to the photodiode which forms the unit pixel 6. Accordingly, the plurality of microlenses 12 are two-dimensionally arranged in a matrix form in a similar way to the unit pixels 6. The microlens 12 focuses light incident from the outside on the photodiode of the corresponding unit pixel 6.

The external connection area 5 is formed outside the peripheral circuit area 4. An electrode pad 14 is formed on the external connection area 5. The electrode pad 14 is a section formed as a part of the wiring layer 9 which forms the stacked wiring layer 7, and is exposed to the outside in the external connection area 5. The electrode pad 14 includes a connection surface 14*a* for electric connection, and is exposed to the outside from the connection surface 14*a*. The connection surface 14*a* is formed as a surface (front surface) of an upper side of the electrode pad 14. In the present embodiment, the electrode pad 14 is formed as a part of the uppermost wiring layer 9*a*.

The electrode pad 14 is connected with a portion of the wiring layer 9 in the imaging area 3 or the like, through a drawing wiring or the like formed in the stacked wiring layer 7. The plurality of electrode pads 14 are arranged along an outer edge of the semiconductor substrate 2 when seen from a planar view, for example.

In the present embodiment, the electrode pad 14 is formed by using an alloy (AlCu) of aluminum (Al) and copper (Cu) as a material. Accordingly, among the wiring layers 9 which form the stacked wiring layer 7, the uppermost wiring layer 9*a* which forms at least the electrode pad 14 is formed of AlCu.

An opening section 15 for exposing the electrode pad 14 to the outside is formed on the external connection area 5. That is, the opening section 15 is formed so that the connection surface 14*a* of the electrode pad 14 faces the outside. Accordingly, in the present embodiment, the opening section 15 is formed on the electrode pad 14 to penetrate a part of the passivation film 10 and the interlayer wiring film 8 which forms the interlayer wiring layer 7. The opening section 15 is opened in a rectangular form when seen from a planar view, for example.

A metallic wire 16 is connected to the electrode pad 14 by wire bonding. The metallic wire 16 is connected to the connection surface 14*a* of the electrode pad 14. Thus, the electrode pad 14 is electrically connected to a lead frame from which a lead wire is extended or the like, for example. The solid-state imaging device 1 according to the present embodiment is a CMOS image sensor of a general front surface reflection type, but may be a CMOS image sensor of a so-called rear surface irradiation type in which the semiconductor substrate 2 and the stacked wiring layer 7 change their place with each other.

In the solid-state imaging device 1 according to the present embodiment having such a configuration, the electrode pad 14 is formed by a preparatory process, in a manufacturing process of the solid-state imaging device 1. The electrode pad 14 is exposed to the outside by removing the stacked films on the electrode pad 14, from a state where the electrode pad 14 and the stacked films of the stacked wiring layer 7, the passivation film 10 and the like which cover the electrode pad 14 are formed on the semiconductor substrate 2. The stacked films on the electrode pad 14 are removed by a dry etching process using etching gas, and the opening section 15 which exposes the electrode pad 14 is formed as a portion in which the stacked films are removed.

Further, in a post process after the preparatory process including a method of forming the electrode pad 14, as a process for electric connection with the electrode pad 14, the wire bonding of connecting the metallic wire 16 to the electrode pad 14 is performed. Further, in the post process, before the wire bonding process is performed, a wafer test through a test measurement (probing) using a probe needle, a dicing process of cutting and separating a wafer into a plurality of chips, a rear surface grinding process of easily performing the dicing process, and the like are performed. In the dicing process, the wafer is cut by a disk-shaped diamond blade which rotates at high speed, for example, while cooling water is being applied thereto.

In the solid-state imaging device 1 manufactured as described above, when the dicing process is performed in the post process as described above, the electrode pad 14 with the connection surface 14a being exposed is in contact with water (pure water) which is used as the cooling water, to thereby generate corrosion (galvanic corrosion) of a patchy pattern on the connection surface 14a of the electrode pad 14. Here, a generation mechanism of the corrosion (hereinafter, referred to as "pad corrosion") on the connection surface 14a of the electrode pad 14 will be described with reference to FIG. 2.

[Generation Mechanism of Pad Corrosion]

Figure 2:
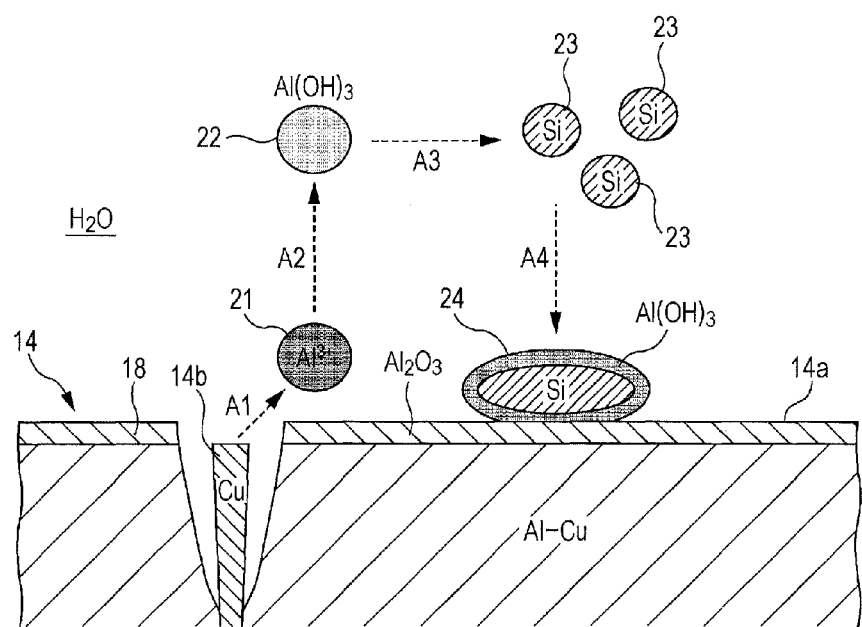
FIG. 2 is a diagram illustrating a mechanism of corrosion generation.

FIG. 2 is an enlarged view of a front layer portion of the electrode pad 14 formed of AlCu as described above. As shown in FIG. 2, in the dicing process, the pure water which is the cooling water is in contact with the front surface of the electrode pad 14 made of AlCu, and thus, Al having a low standard electrode potential is ionized and is eluted as an Al ion ($Al^{3+}$) (see arrow A1) 21. This is based on the fact that the water is conductive in a state where Al and Cu which are dissimilar metals are on the front surface of the electrode pad 14. Electrons generated according to the ionization of Al are combined with hydrogen ions ($H^+$) in the water to generate hydrogen ($H_2$) (oxidation of Al and reduction of hydrogen). In this way, as the water is in contact with the electrode pad 14 made of AlCu, a phenomenon occurs in which Al which is metal having a low standard electrode potential is oxidized by the galvanic effect to be dissolved in the water.

In other words, the cause of the pad corrosion generated on the front surface of the electrode pad 14 is that an electric potential difference is generated between Al and Cu due to the difference between the standard electrode potentials, and countless local cells are present on the front surface of the electrode pad 14. Thus, the galvanic effect as mentioned above is generated on the front surface of the electrode pad 14, and the Al ion 21 is eluted.

The eluted Al ion 21 reacts with the water to become aluminum hydroxide ($Al(OH)_2$) 22 (see arrow A2). The aluminum hydroxide 22 which is a reaction product of the Al ion 21 and the water is in contact with a silicon (Si) scrap 23 which is a cutting layer of the wafer generated in the dicing process (see arrow A3), to thereby generate a combined product 24 obtained by covering the front surface of the silicon scrap 23 with the aluminum hydroxide 22.

The combined product 24 is firmly attached to the front surface (connecting surface 14a) of the electrode pad 14 by the aluminum hydroxide which covers the front surface. In this way, as the combined product 24 which is formed by the aluminum hydroxide 22 and the silicon scrap 23 is attached to the front surface of the electrode pad 14, an abnormal pad is generated in which the combined product 24 is attached to the vicinity of the pad corrosion on the front surface of the electrode pad 14 (see FIG. 10A).

In the example shown in FIG. 2, a passive layer 18 which is formed of aluminum oxide ($Al_2O_3$) is present on the front surface of the electrode pad 14 to which the combined product 24 is attached. The passive layer 18 is formed by allowing the connection surface 14a of the electrode pad 14 to react with oxygen in the atmosphere, after the process of exposing the connecting surface 14a of the electrode pad 14 by the dry etching process as described above and a resist separation process is then performed. That is, the passive layer 18 is a natural oxide film.

In the process of exposing the connection surface 14a of the electrode pad 14, gas which includes fluorine (F) is used as the etching gas in the dry etching process for exposing the connecting surface 14a of the electrode pad 14. Thus, fluorine is implanted into the front surface of the electrode pad 14 made of AlCu, and a compound such as aluminum fluoride ($AlF_x$) is generated. Due to the existence of the aluminum fluoride or the like, growing foreign substances which are called F corrosion may be generated on the front surface of the electrode pad 14. Thus, it is preferable to add a process of removing the aluminum fluoride or the like generated on the front surface of the electrode pad 14. As the process of removing the aluminum fluoride or the like, an alkali process using a developing solution or the like is used, for example. Since the front surface of the electrode pad 14 from which the aluminum fluoride is removed by the alkali process or the like is also pure aluminum (Al), this is easily bonded with oxygen in the atmosphere, and thus, aluminum oxide ($Al_2O_3$) is naturally generated on the front surface of the electrode pad 14. The passive layer 18 is formed by the aluminum oxide generated in this way.

Further, as shown in FIG. 2, as the Al ion is eluted from the electrode pad 14 as described above, a copper section 14b which is locally present in the electrode pad 14 is deposited.

As described above, the pad corrosion on the front surface of the electrode pad 14 reduces an effective contact area which is a bonding surface between the electrode pad 14 and the metal wire 16 (see FIG. 1) connected with the electrode pad 14 due to the combined product 24 generated according to the pad corrosion, which causes poor connection such as decrease in mechanical bonding strength or poor electric contact. Further, the pad corrosion generated on the front surface of the electrode pad 14 causes an inferior appearance. Further, the poor connection in the electrode pad 14 causes complaints of a user in view of reliability.

Thus, in the manufacturing method of the solid-state imaging device 1 according to the present embodiment, in order to suppress the pad corrosion generated on the front surface of the electrode pad 14, the following processes are performed.

[First Embodiment of Manufacturing Method of Solid-State Imaging Device]

Figure 3:
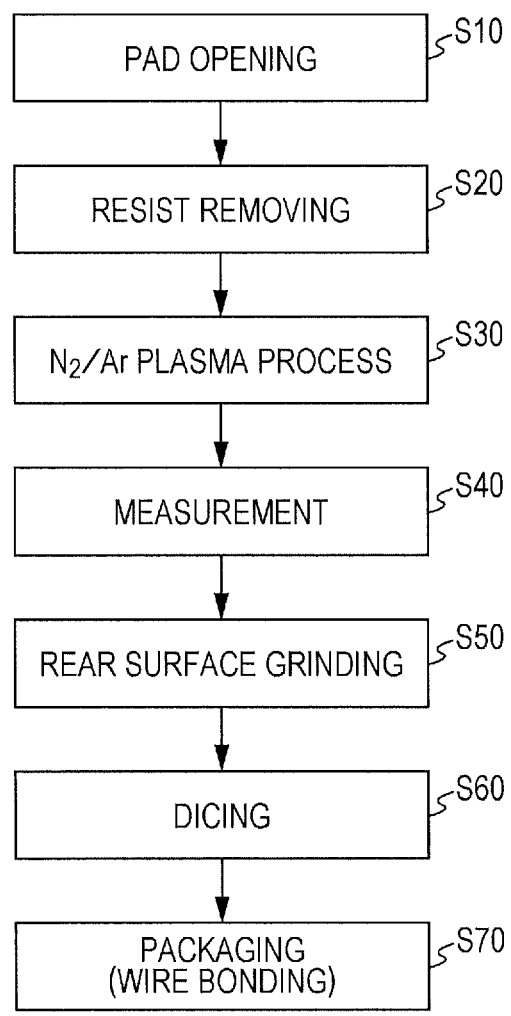
FIG. 3 is a flowchart illustrating a manufacturing method according to an embodiment of the present disclosure.

A manufacturing method of the solid-state imaging device 1 according to a first embodiment will be described with reference to a flowchart of FIG. 3. As shown in FIG. 3, the manufacturing method according to the present embodiment includes a process of opening a pad (S10). That is, in this process, a part of a stacked wiring layer 7 which covers the electrode pad 14 and a stacked film such as a passivation film 10 or the like are removed by a dry etching process using etching gas, and thus, the opening section 15 which exposes the electrode pad 14 is formed.

Figure 4A:
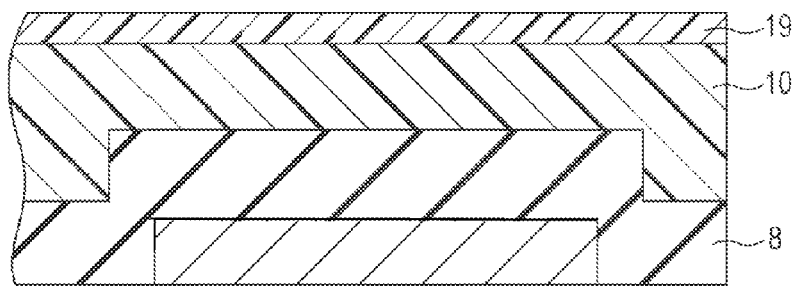
FIGS. 4A and 4B are diagrams illustrating a manufacturing method according to an embodiment of the present disclosure.
Figure 4B:
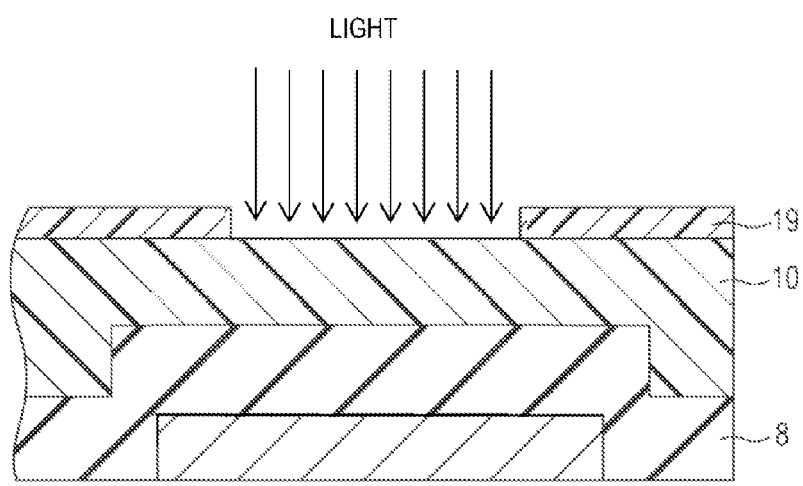

Specifically, in the manufacturing method according to the present embodiment, firstly, the stacked wiring layer 7 and the passivation film 10 are sequentially formed on the semiconductor substrate 2. Thereafter, as shown in FIGS. 4A and 4B, in the pad opening process, light exposure using a photomask or the like is performed, and thus, a resist film 19 is formed on the passivation film 10. The resist film 19 is formed in a region where a portion corresponding to the electrode pad 14 is removed.

Figure 5:
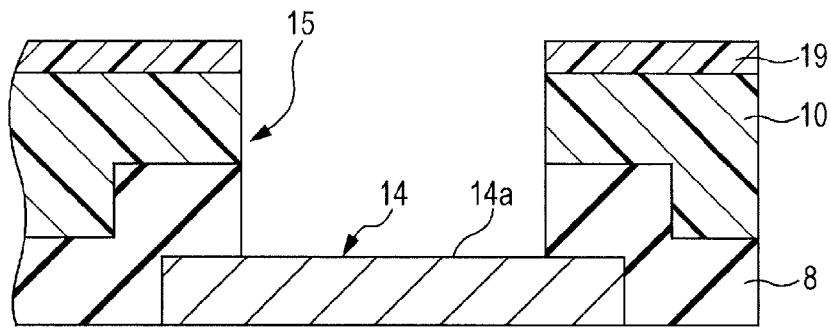
FIG. 5 is a diagram illustrating a manufacturing method according to an embodiment of the present disclosure.

Further, as shown in FIG. 5, in the pad opening process (S10), the dry etching process using the etching gas is performed, and thus, the stacked film on the upper side of the electrode pad 14 is selectively etched and removed by the resist film 19. Thus, the opening section 15 corresponding to the size of the electrode pad 14 is formed and the connection surface 14a of the electrode pad 14 is exposed.

As the etching gas used for performing the dry etching process, for example, tetrafluoromethane ($CF_4$) which is fluorocarbon-based gas is used. Here, as the etching gas, trifluoromethane ($CHF_2$) gas, fluoromethane ($CH_2F$) gas, hexafluoromethane ($C_2F_6$) gas, perfluoropropane ($C_3F_8$) gas, octafluorocyclobutane ($C_4F_8$) gas, hexafluoro-1,3-butadiene ($C_4F_6$) gas, difluoromethane ($CH_2F_2$) gas, or mixed gas thereof may be used, instead of $CF_4$ gas.

Figure 6:
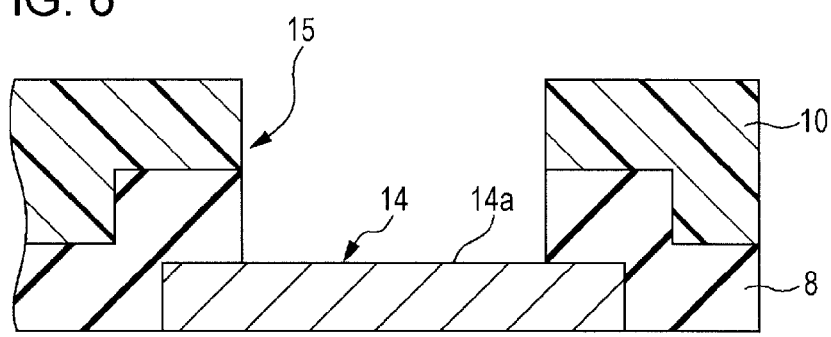
FIG. 6 is a diagram illustrating a manufacturing method according to an embodiment of the present disclosure.

As shown in FIG. 3, after the pad opening process (S10) is performed, a process of removing the resist is performed (S20). That is, as shown in FIG. 6, as described above, in the pad opening process, the resist film 19 (see FIG. 5) which is formed on the passivation film 10 is removed.

Specifically, by using an organic solvent or the like such as a thinner, the resist film 19 which remains on the passivation film 10 is separated.

Figure 7:
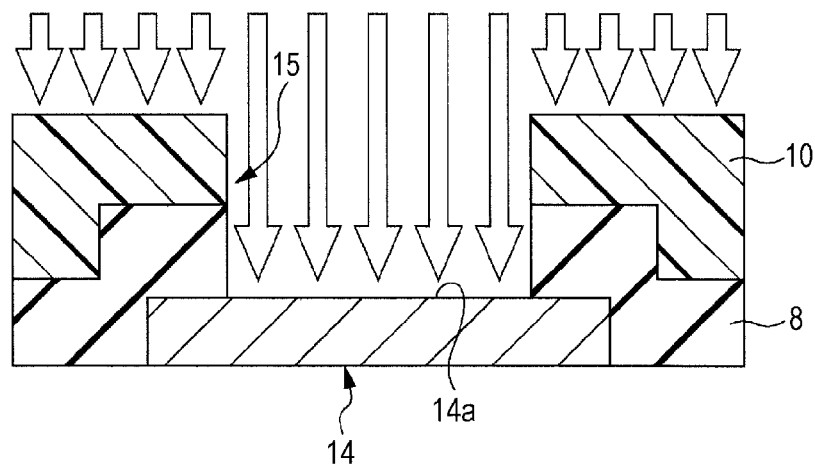
FIG. 7 is a diagram illustrating a manufacturing method according to an embodiment of the present disclosure.

Next, an $N_2$/Ar plasma process is performed (S30). That is, as shown in FIG. 7, a plasma process of allowing $N_2$/Ar plasma generated by a mixture gas of nitrogen ($N_2$) and argon (Ar) to irradiate a range which includes the connection surface 14a of the electrode pad 14 which is an exposed surface of the wiring layer 9 (9a) is performed.

As a plasma process condition according to the present embodiment, for example, the total flow rate of nitrogen gas and argon gas is 10 to 1000 sccm, the ratio of nitrogen gas to the total flow rate of the gas is 1 to 99%, the pressure of the processing atmosphere is 0.1 to 2 Pa, the temperature of a processing atmosphere is −30 to 50° C., plasma source power is 100 to 2000 W, and bias power applied to the side of wafer is 0 to 2000 W. Here, the unit "sccm" represents the flow rate ($cm_3$/min) of gas in a normal state. An optimal condition in the plasma processing condition is changed according to a discharging method or the like of plasma.

Further, in the present embodiment, as a plasma source for generating $N_2$/Ar plasma, ECR (Electron Cyclotron Resonance) plasma which is a kind of high-density plasma is used. The plasma process according to the present embodiment may be performed in a processing room which is the same as a processing room where the etching process in the above-described pad opening process is performed, or may be performed in a processing room which is different from the processing room where the etching process is performed. In other words, it is not necessary to perform the plasma process according to the present embodiment in the processing room which is the same as the processing room where the etching process is performed, and after the etching process, the processing target may be dried in the atmosphere.

Subsequently, a measurement process for confirming an operation of the solid-state imaging device 1 is performed (S40). In this process, test measurement of the wafer using the probe needle (probing) is performed.

Next, a rear surface grinding process is performed (S50). In this process, an operation of grinding the rear surface of the semiconductor substrate 2 which forms the solid-state imaging device 1 and finishing the thickness of the solid-state imaging device 1 to become constant is performed. Specifically, for example, a grinding stone which is disposed above moves down to a wafer which is being adsorbed and maintained on a table which is called a rotation chuck or the like, and is in contact with a grinding surface of the wafer by a predetermined force, in a state where the wafer and the grinding stone are relatively rotated. Accordingly, the grinding surface of the wafer is ground by the grinding stone and the wafer is scraped with a predetermined thickness.

Further, the dicing process is performed (S60). In this process, the wafer is cut while cooling water is supplied thereto by a disk-shaped diamond blade which rotates at high speed, for example. Thus, the wafer is separated into a plurality of semiconductor chips.

In order to assemble the solid-state imaging device 1 which is individualized by the dicing process (S60) in an electronic apparatus such as a digital camera, for example, a packaging process is performed (S70). In the packaging process, an external condensing lens is mounted, or the solid-state imaging device 1 is mounted on a package, for example. In this process, the wire bonding process of electrically connecting the electrode pad 14 of the solid-state imaging device 1 to a lead frame of the package is performed.

In the manufacturing method according to the present embodiment described above, the pad opening process (S10) corresponds to the process of exposing the wiring layer 9 (9a) which is formed of the alloy including two or more types of metals having different standard electrode potentials on one surface side of the semiconductor substrate 2. Further, in the present embodiment, the wiring layer 9 (9a) includes the electrode pad 14 having the connection surface 14a for electric connection as the exposed surface.

Further, in the manufacturing method of the present embodiment, the $N_2$/Ar plasma process (S30) corresponds to the plasma process of allowing the plasma generated by the mixture gas of a gas including nitrogen and an inert gas to irradiate the range which includes the exposed surface of the wiring layer 9 (9a), that is, the connection surface 14a of the electrode pad 14. That is, in the present embodiment, with respect to the mixed gas which generates plasma, as the gas including nitrogen, the $N_2$ gas is employed, and as the inert gas, the Ar gas is employed.

In the manufacturing method of the present embodiment, the $N_2$/Ar plasma process is performed before the measurement process (S40) after the resist removing process (S20), but is not limited thereto. In the manufacturing method of the present embodiment, the $N_2$/Ar plasma process is performed with respect to the range which includes the front surface of the electrode pad 14 being exposed, and the pad corrosion due to the contact between the front surface of the electrode pad 14 and water during the dicing process is basically suppressed.

To this end, after the $N_2$/Ar plasma process (S30) is performed, the manufacturing method of the present embodiment includes the dicing process of cutting and separating the semiconductor substrate 2 into the plurality of chips (S60). Accordingly, so long as the $N_2$/Ar plasma process is performed after the pad opening process (S10) and before the dicing process (S60), any timing may be adopted.

That is, in the manufacturing method of the present embodiment, the $N_2$/Ar plasma process may be performed between the pad opening process (S10) and the resist removing process (S20). Further, the N$_2$/Ar plasma process may be performed between the measurement process (S40) and the rear surface grinding process (S50). Further, the N$_2$/Ar plasma process may be performed between the rear surface grinding process (S50) and the dicing process (S60).

Here, in a case where the N$_2$/Ar plasma process is performed between the pad opening process (S10) and the resist removing process (S20), attention should be paid. In a case where the resist film 19 considerably remains on the passivation film 10, or in similar cases, the resist film 19 may be cured to cause difficulties in the resist removal, according to the plasma processing condition, the wafer state, or the like. Accordingly, in a case where the N$_2$/Ar plasma process is performed before the resist removing process (S20), the plasma processing condition is set such that the resist is not cured.

According to the manufacturing method of the present embodiment as described above, it is possible to suppress generation of pad corrosion which is generated on the connection surface 14a of the electrode pad 14 which is the exposed surface of the wiring layer 9 (9a) due to contact of water with the connection surface 14a of the electrode pad 14 in the dicing process or the like and causes reduction in the bonding strength on the connection surface 14a of the electrode pad 14, an inferior appearance, or the like. Hereinafter, an estimation mechanism about the above-described effect will be described.

[Estimation Mechanism]

In the solid-state imaging device 1 according to the present embodiment, as the above-described N$_2$/Ar plasma process is performed, different reactions are generated in an AlCu section and a Cu section on the front surface of the electrode pad 14. That is, as shown in FIG. 8, in the electrode pad 14 which is made of AlCu, since the copper section 14b which is locally present exists, as the front surface of the electrode pad 14 which is irradiated by the N$_2$/Ar plasma, there are an AlCu front surface section 31 which is a front section of AlCu which occupies the main part and a Cu front surface section 32 which is a front surface section of the copper section 14b which is locally present. Further, on the AlCu front surface section 31 and the Cu front surface section 32, different effects are obtained by the N$_2$/Ar plasma process.

Specifically, in the portion of the AlCu front surface section 31, as described above, after the connection surface 14a of the electrode pad 14 is exposed to be left in the atmosphere, the passive layer 18 is formed. Generally, the passive layer 18 is formed of aluminum oxide (Al$_2$O$_3$). As the portion of the AlCu front surface section 31 in which the passive layer 18 is formed is irradiated by the N$_2$/Ar plasma, the passive layer 18 is etched by the irradiation of Ar ions and is nitrided (nitriding).

The passive layer 18 is a highly stable layer, and is formed with the thickness of about 0.1 to about 25 nm depending on the material which forms the electrode pad 14. In the portion of the AlCu front surface section 31 in which the passive layer 18 is formed as described above is covered by the passive layer 18, and thus, the passive layer 18 is removed by a certain method, to thereby expose the front surface of pure Al. Since Ar which forms the N$_2$/Ar plasma is a relatively heavy element, if it is ionized for irradiation, a sputtering phenomenon is caused on the side irradiated by the plasma.

Accordingly, as the N$_2$/Ar plasma process is performed, on the AlCu front surface section 31, the highly stable passive layer 18 is not nitrided in the initial stage, and is etched by the sputtering process due to Ar ion. Further, if the passive layer 18 is removed by the sputtering process, the pure Al is exposed on the front surface. If the pure Al is exposed on the front surface, nitrogen (radical, ion) which is activated by the plasma is combined with Al to start nitriding of Al.

As shown in FIG. 9, as Al is nitrided, an aluminum oxide (AlN) layer 34 is formed. AlN is a chemically stable composition, and thus, the aluminum oxide layer 34 functions as a blocking layer against the pure water during the dicing process. In this way, the AlCu front surface section 31 is nitrided by being irradiated by the N$_2$/Ar plasma. In this regard, a result is obtained in which nitrogen is detected in the portion of the AlCu front surface section 31 by an X-ray spectroscopic analysis (XPS).

On the other hand, the portion of the Cu front surface section 32 is nitrided by being irradiated by the N$_2$/Ar plasma, and thus, a Cu—N layer 33 is formed. Cu—N is a chemically stable composition, and thus, the Cu—N layer 33 functions as a blocking layer against the pure water during the dicing process. That is, as the portion of the Cu front surface section 32 is irradiated by the N$_2$/Ar plasma, the Cu—N layer 33 is formed on the Cu front surface section 32, and the AlCu section and the copper section 14b in the electrode pad 14 are blocked from being directly in contact with the pure water by the Cu—N layer 33. Thus, the galvanic effect is not generated on the front surface of the electrode pad 14, thereby preventing Al from being eluted. Consequently, it is possible to prevent generation of the pad corrosion on the front surface of the electrode pad 14.

That is, in the manufacturing method according to the present embodiment, since the mixed gas of N$_2$ and Ar is used for generating the plasma, the removal of the passive layer 18 due to the sputtering operation of Ar, the nitriding of the Al surface due to the removal of the passive layer 18, and the nitriding of the eluted Cu surface are simultaneously performed, and thus, the front surface of the electrode pad 14 is entirely nitrided. Thus, the blocking layer against water is formed on the front surface of the electrode pad 14, thereby suppressing the pad corrosion.

In this way, in the manufacturing method of the present embodiment, the front surface of Cu (portion of the Cu front surface section 32) of the metal having a high standard electrode potential among the metals which forms the electrode pad 14, that is, Cu in the present embodiment and the Al portion of the AlCu front surface section 31 can be nitride at the same time. Thus, since the pad corrosion due to the galvanic effect is prevented, it is possible to maintain the surface of the electrode pad 14 as a smooth state, and to prevent deterioration of the bonding strength of the wire bonding.

As described above, according to the manufacturing method of the present embodiment, since it is possible to form the electrode pad 14 without pad corrosion, the contact area of the connection surface 14a of the electrode pad 14 and the metal wire 16 which is connected by wire bonding is increased, the bonding strength is increased, and superior electric connection is achieved. Thus, it is possible to enhance reliability of the wire bonding.

Further, as the contact area of the connection surface 14a of the electrode pad 14 and the metal wire 16 is increased, a margin on the connection surface 14a is increased, to thereby easily cope with the size reduction of the electrode pad 14 which is a recent trend. Further, in the electrode pad 14, since the pad corrosion is not generated and the reliability of wire bonding is enhanced, it is possible to considerably reduce time for treating complaints from customers.

Further, according to the manufacturing method of the present embodiment, it is possible to suppress corrosion which is Al corrosion due to F (fluorine) on the front surface of the electrode pad 14. Specifically, the irradiation of the $N_2$/Ar plasma causes the above-described sputtering phenomenon. The front layer of the electrode pad 14 is etched by several nm by the sputtering operation due to the $N_2$/Ar plasma. Thus, F which is present around the front surface of the electrode pad 14 is removed to reduce the amount of F of the AlCu front surface section 31, and to suppress the corrosion due to F. In this regard, the result that the amount of F in the portion of the AlCu front surface section 31 is reduced by the irradiation of the $N_2$/Ar plasma is obtained by the X-ray spectroscopic analysis (XPS).

The solid-state imaging device 1 which is manufactured by the manufacturing method of the present embodiment has the following configuration. That is, the solid-state imaging sensor 1 of the present embodiment includes the semiconductor substrate 2 (see FIG. 1), the electrode pad 14 which is the wiring layer 9 formed of AlCu which is an alloy including two or more types of metals having different standard electrode potentials on one surface side of the semiconductor substrate 2, and the nitride layer formed on the front layer of the surface which is irradiated by the $N_2$/Ar plasma of the electrode pad 14 as the electrode pad 14 is irradiated by the $N_2$/Ar plasma. The nitride layer is formed of both metals of Al and Cu which forms the front surface of the electrode pad 14. The solid-state imaging device 1 of the present embodiment includes the Cu—N layer 33 which is a nitride layer formed on the front layer of the Cu portion having a relatively high standard electrode potential among Al and Cu and the aluminum oxide layer 34 which is a nitride layer formed on the front layer of the Al portion (see FIG. 9).

According to the solid-state imaging device 1 of the present embodiment having such a configuration, as described above, it is possible to suppress pad corrosion and to enhance the bonding strength of wire bonding.

Figure 10A:
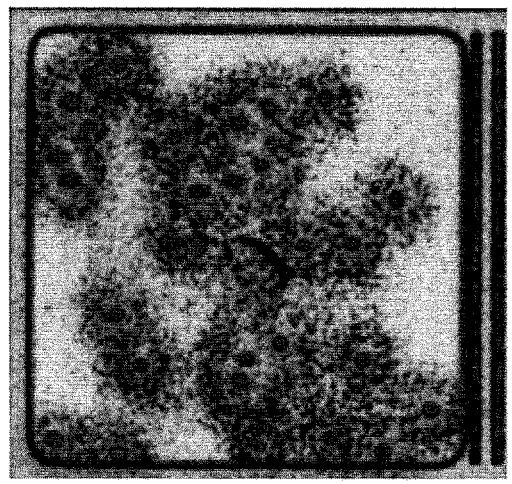
FIGS. 10A and 10B are diagrams illustrating comparison of corrosion generation between an embodiment of the present disclosure and an example in the related art.
Figure 10B:
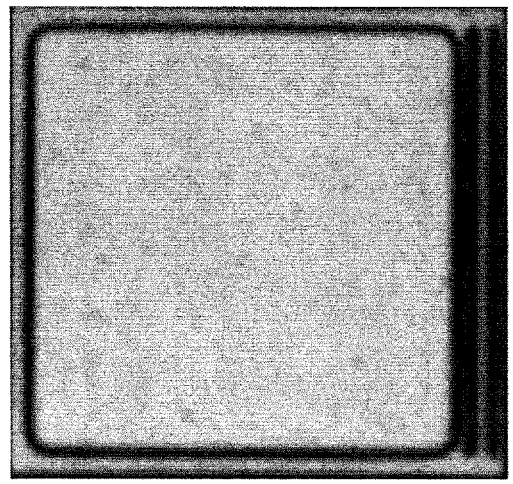

FIGS. 10A and 10B show photographs of front surfaces of an electrode pad manufactured by a method in the related art and the electrode pad manufactured by the manufacturing method of the present embodiment. FIG. 10A shows a photograph of the front surface of the electrode pad after a dicing process (see FIG. 3, S60) in a case where a manufacturing method in the related art is employed, that is, in a case where the $N_2$/Ar plasma process is not performed. As understood from the photograph in FIG. 10A, in the case where the solid-state imaging device 1 is manufactured by the method in the related art, a patchy pattern is generated on the front surface of the electrode pad as pad corrosion. As described above, this pad corrosion is generated by the galvanic effect as the pure water is in contact with the front surface of the electrode pad during the dicing process.

On the other hand, FIG. 10B shows a photograph of the front surface of the electrode pad after the dicing process (see FIG. 3, S60) in a case where the manufacturing method of the present embodiment is employed, that is, in a case where the $N_2$/Ar plasma process is performed. As understood from the photograph in FIG. 10B, according to the manufacturing method of the present embodiment, the pad corrosion is suppressed on the front surface of the electrode pad. In this way, from the comparison result of FIGS. 10A and 10B, it can be understood that the pad corrosion on the front surface of the electrode pad is considerably suppressed according to the manufacturing method of the present embodiment.

Figure 11:
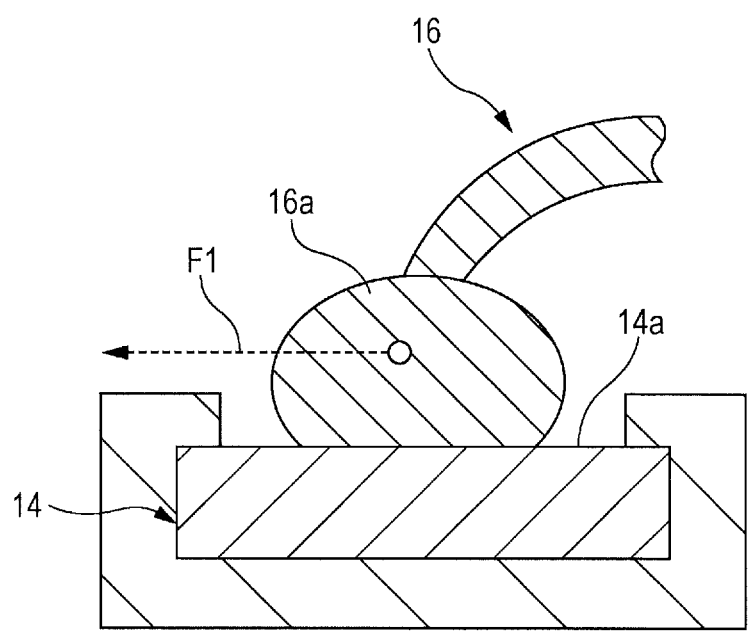
FIG. 11 is a diagram illustrating measurement of a bonding strength due to wire bonding according to an embodiment of the present disclosure.

Next, an example of measurement result of the bonding strength due to wire bonding in a case where the manufacturing method in the related art is employed and in a case where the manufacturing method of the present embodiment is employed will be described. As shown in FIG. 11, in the measurement, by applying stress (see arrow F1) of a predetermined direction and a predetermined size to the bonding section 16*a* of the metal wire 16 which is connected to the connection surface 14*a* of the electrode pad 14 by wire bonding, the share strength which is the bonding strength of wire bonding is measured.

Figure 12:
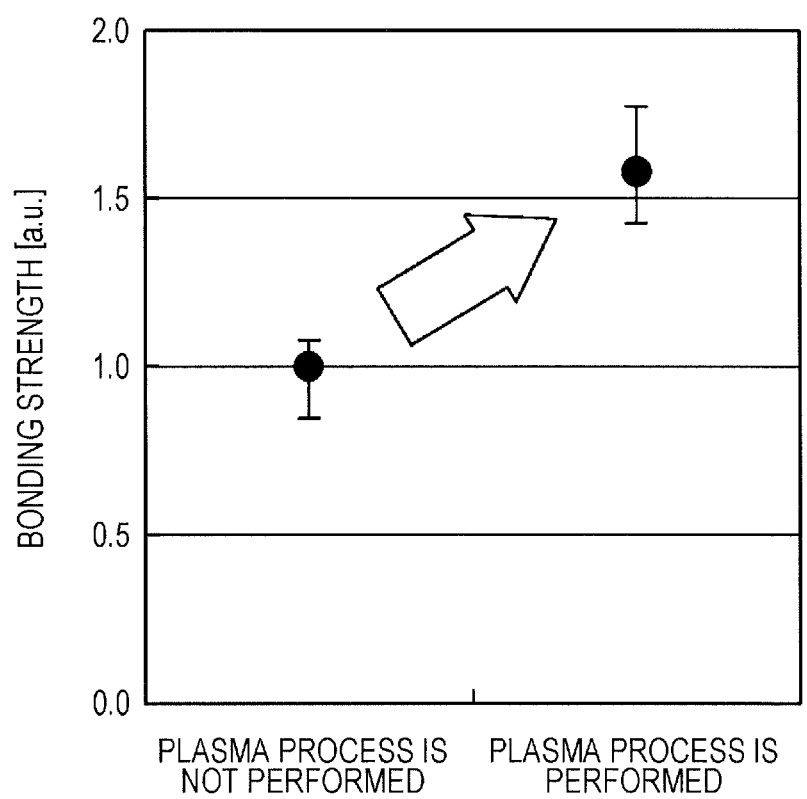
FIG. 12 is a diagram illustrating an example of a measurement result of a bonding strength according to an embodiment of the present disclosure and an example in the related art.

FIG. 12 shows an example of the measurement result. In the graph shown in FIG. 12, the longitudinal axis indicating the bonding strength has an arbitrary unit. As shown in FIG. 12, in this measurement result example, in the case where the manufacturing method of the present embodiment is employed, 1.5 times or more bonding strength is obtained, compared with the case where the manufacturing method in the related art is employed. In this way, in the manufacturing method of the present embodiment where the $N_2$/Ar plasma process is performed has a proven effect in view of the bonding strength of wire bonding.

[Second Embodiment of Manufacturing Method of Solid-State Imaging Device]

A second embodiment of the manufacturing method will be described. The manufacturing method of the present embodiment is different from the manufacturing method of the first embodiment in that a process of removing the passive layer 18 is included between the pad opening process and the plasma process. Thus, the same sections as in the manufacturing method of the first embodiment are given the same reference numerals, and description thereof will be appropriately omitted.

Figure 13:
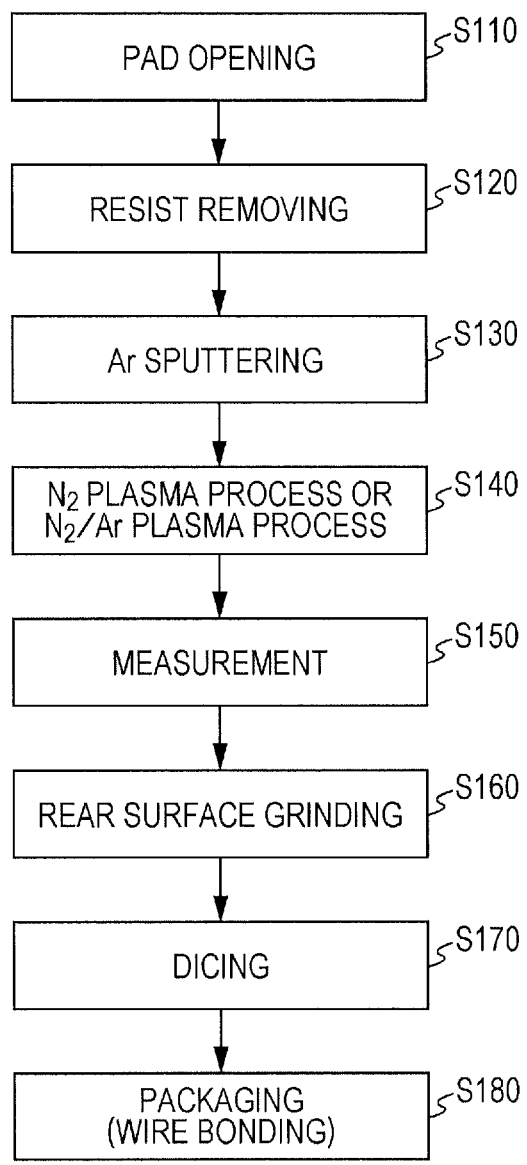
FIG. 13 is a flowchart illustrating a manufacturing method according to an embodiment of the present disclosure.

The manufacturing method of the present embodiment will be described with reference to a flowchart shown in FIG. 13. As shown in FIG. 13, in a similar way to the first embodiment, in the manufacturing method of the present embodiment, after a pad opening process (S110) is performed, a resist removing process (S120) is performed. Further, in the manufacturing method of the present embodiment, after the resist removing process (S120) is performed, an Ar sputtering process using argon gas is performed (S130).

The Ar sputtering process is performed for removing the passive layer 18 formed on the front surface of the electrode pad 14. As described above, as the connection surface 14*a* of the electrode pad 14 is exposed and left in the atmosphere, the passive layer 18 is formed on the front surface of the electrode pad 14. The passive layer 18 is mainly generated in the AlCu front surface section 31, on the surface of the electrode pad 14.

Thus, as shown in FIG. 14A, in the Ar sputtering process, Ar plasma generated by argon gas irradiates the front surface of the electrode pad 14. Thus, as shown in FIG. 14B, the passive layer 18 formed on the front surface of the electrode pad 14 is removed. As the process for removing the passive layer 18 formed on the front surface of the electrode pad 14, an etching process due to the irradiation of plasma generated by chlorine-based gas, a wet etching process of using alkaline-based chemicals represented as TMAH (tetramethylammonium hydroxide), or the like, for example, may be used, instead of the Ar sputtering process.

Figure 15:
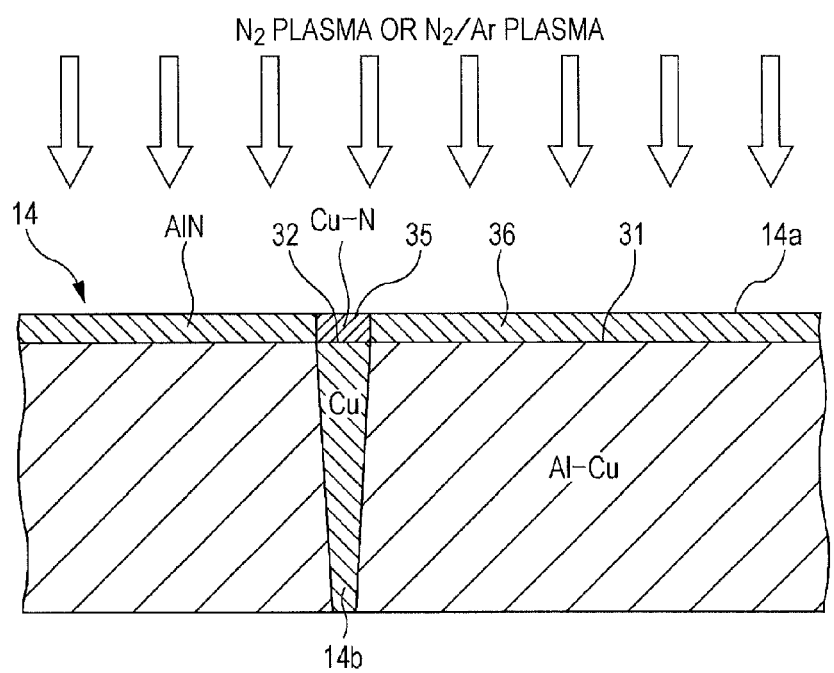
FIG. 15 is a partially enlarged cross-sectional view illustrating a configuration of a solid-state imaging device according to an embodiment of the present disclosure.

Next, an $N_2$ plasma process or an $N_2$/Ar plasma process is performed (S140). In the manufacturing method of the present embodiment, in the $N_2$ (or $N_2$/Ar) plasma process, the passive layer 18 is removed in advance, and thus, as shown in FIG. 15, the $N_2$ (or $N_2$/Ar) plasma thoroughly irradiates the front surface of the electrode pad 14.

In the manufacturing method of the present embodiment, since the passive layer 18 is removed in advance before the plasma processing process (S140), plasma generated by the gas including nitrogen without including an inert gas such as Ar may be used in the plasma processing process (S140). Thus, in the manufacturing method of the present embodiment, the plasma process in the plasma processing process (S140) may be the $N_2$ plasma process.

That is, as described above, since Ar is a relatively heavy element, as Ar is ionized, the sputtering phenomenon is caused on the side irradiated by plasma. On the other hand, since the nitrogen (N) is a relatively light element, although there is difference in the plasma processing condition or the like, the sputtering phenomenon like in the Ar case is barely generated in the $N_2$ plasma process. In this regard, if bias power which is the plasma processing condition is increased, the electric field strength is increased, and thus, the ionized nitrogen has a large amount of energy, and the sputtering phenomenon may be generated.

In the plasma processing process, in the case where the $N_2$ plasma process is performed, in a similar way to the $N_2$/Ar plasma process, the plasma process of allowing the $N_2$ plasma generated by nitrogen ($N_2$) to irradiate the range including the connection surface 14a of the electrode pad 14 which is the exposed surface of the wiring layer 9 (9a) is performed.

Further, a measurement process (S150) for confirming an operation of the solid-state imaging device 1, a rear surface grinding process (S160), a dicing process (S170), and a packaging process (wire bonding) (S180) are sequentially performed.

In the above-described manufacturing method of the present embodiment, in a similar way to the manufacturing method of the first embodiment, in the pad opening process (S110), the passive layer 18 formed on the connection surface 14a of the electrode pad 14 which is the exposed surface is generated. Further, the process of removing the passive layer 18 is performed between the pad opening process (S110) and the $N_2$/Ar plasma processing process (S140). That is, in the manufacturing method of the present embodiment, the Ar sputtering process (S130) corresponds to the process of removing the passive layer 18.

Further, in the manufacturing method of the present embodiment, the process (S140) of performing the $N_2$ plasma processing or the $N_2$/Ar plasma processing corresponds to the process of performing the plasma process of allowing the plasma generated by the mixture gas of the gas including nitrogen and the inert gas or the plasma generated by the gas including nitrogen to irradiate the range which includes the exposed surface of the wiring layer 9 (9a), that is, the connection surface 14a of the electrode pad 14. That is, in the present embodiment, with respect to the gas generating the plasma, as the gas including nitrogen, $N_2$ gas is employed, and as the inert gas, Ar gas is employed.

In the manufacturing method of the present embodiment, the Ar sputtering process is performed before the $N_2$ (or $N_2$/Ar) plasma process (S140) after the resist removing process (S120), but may be performed between the pad opening process (S110) and the resist removing process (S120).

Further, in the manufacturing method of the present embodiment, so long as the $N_2$ (or $N_2$/Ar) plasma process is performed after the Ar sputtering process and before the dicing process (S60), the process may be performed at any timing. Here, in a similar way to the above-described manufacturing method of the present embodiment, in a case where the $N_2$ (or $N_2$/Ar) plasma process is performed between the pad opening process (S110) and the resist removing process (S120), attention should be paid considering that the resist film 19 may be cured by the plasma processing condition, the wafer state or the like.

According to the above-described manufacturing method of the present embodiment, in a similar way to the first embodiment, it is possible to suppress generation of pad corrosion which causes reduction in the bonding strength on the connection surface 14a of the electrode pad 14, an inferior appearance, or the like. In the case of the present embodiment, the above effect is obtained by the following estimation mechanism.

[Estimation Mechanism]

In the manufacturing method of the present embodiment, since the passive layer 18 is removed in the $N_2$ (or $N_2$/Ar) plasma process, as shown in FIG. 15, on the front surface of the electrode pad 14, the AlCu front surface section 31 and the Cu front surface section 32 are uniformly irradiated by the $N_2$ (or $N_2$/Ar) plasma. Thus, in a similar way to the case of the first embodiment, the portion of the Cu front surface section 32 is nitrided by the irradiation of the $N_2$ (or $N_2$/Ar) plasma, and thus, a Cu—N layer 35 is formed.

On the other hand, in a similar way to the portion of the Cu front surface section 32, the portion of the AlCu front surface section 31 is nitrided by the irradiation of $N_2$ (or $N_2$/Ar) plasma, and thus, an aluminum nitride (AlN) layer 36 is formed. AlN is a chemically stable composition, and thus, the aluminum nitride layer 36 functions as a blocking layer against the pure water during the dicing process.

That is, the portion of AlCu and the copper section 14b in the electrode pad 14 are blocked from being directly in contact with the pure water, respectively, by the aluminum nitride layer 36 and the Cu—N layer 35. Thus, the galvanic effect is not generated on the front surface of the electrode pad 14, and Al is prevented from being eluted. Consequently, it is possible to prevent the pad corrosion from being generated on the front surface of the electrode pad 14.

In this way, while the removal of the passive layer 18 and the nitriding of the front surfaces of Al and Cu are simultaneously performed in the manufacturing method of the first embodiment, in the manufacturing method of the present embodiment, the removal of the passive layer 18 due to the Ar sputtering process (irradiation of Ar plasma) and the nitriding of the front surfaces of Al and Cu due to $N_2$ (or N2/Ar) plasma are individually performed, and the front surface of the electrode pad 14 which includes the Cu front surface section 32 and the AlCu front surface section 31 is completely nitrided. Thus, the blocking layer against water is formed on the front surface of the electrode pad 14 to suppress generation of pad corrosion. That is, since the pad corrosion due to the galvanic effect is prevented, it is possible to maintain the front surface of the electrode pad 14 in a smooth state, and to prevent deterioration of the bonding strength of wire bonding.

The solid-state imaging device manufactured by the manufacturing method of the present embodiment has the following configuration. That is, the solid-state imaging device of the present embodiment includes the semiconductor substrate 2 (see FIG. 1), the electrode pad 14 which is the wiring layer 9 which is formed of AlCu which is alloy including two or more types of metals having different standard electrode potentials, on one surface side of the semiconductor substrate 2, and the nitride layer which is formed on the front layer of the surface of the electrode pad 14 irradiated by the $N_2$ (or $N_2$/Ar) plasma as the electrode pad 14 is irradiated by the $N_2$ (or $N_2$/Ar) plasma. The solid-state imaging device 1 of the present embodiment includes the aluminum nitride layer 36 in which the portion of the AlCu front surface section 31 is nitrided and the Cu—N layer 35 in which the portion of the Cu front surface section 32 is nitrided, as the nitride layer (see FIG. 15).

According to the solid-state imaging device of the present embodiment with such a configuration, as described above, it is possible to suppress pad corrosion and to enhance the bonding strength of wire bonding.

Third Embodiment of Manufacturing Method of Solid-State Imaging Device

A third embodiment of the manufacturing method will be described. The manufacturing method of the present embodiment is different from the manufacturing method of the first embodiment in that the $N_2$ plasma process is performed as the plasma process in the plasma processing process. Thus, the same sections as in the manufacturing method of the first embodiment are given the same reference numerals, and description thereof will be appropriately omitted.

Figure 16:
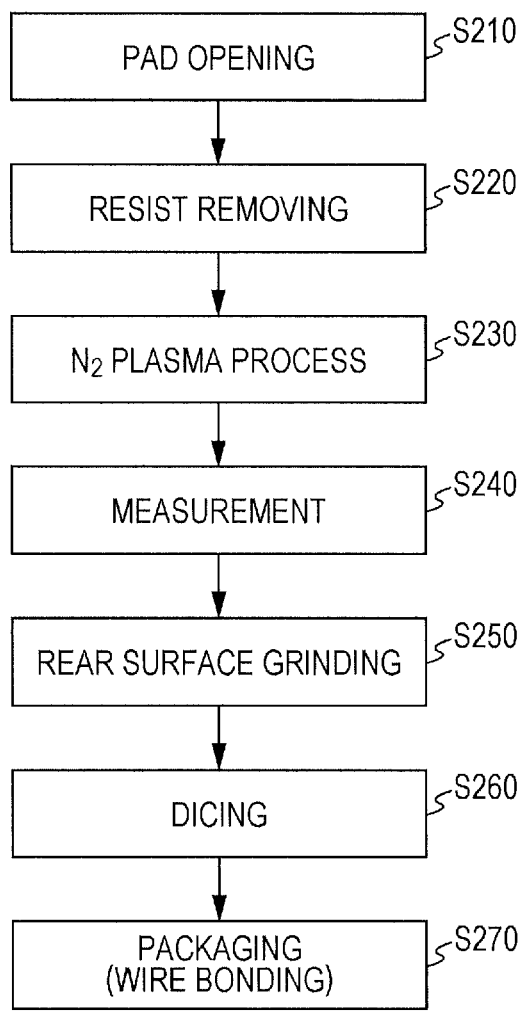
FIG. 16 is a flowchart illustrating a manufacturing method according to an embodiment of the present disclosure.

The manufacturing method of the present embodiment will be described with reference to a flowchart of FIG. 16. As shown in FIG. 16, in a similar way to the first embodiment, in the manufacturing method of the present embodiment, after a pad opening process (S210) is performed, a resist removing process (S220) is performed. Further, in the manufacturing method, after the resist removing process (S220) is performed, an $N_2$ plasma process (S230) is performed. After the $N_2$ plasma process (S230) is performed, in a similar way to the manufacturing method of the first embodiment, a measurement process (S240) for confirming an operation of the solid-state imaging device 1, a rear surface grinding process (S250), a dicing process (S260), and a packaging process (wire bonding) (S270) are sequentially performed.

In the above-described manufacturing method of the first embodiment, in a similar way to the manufacturing method of the present embodiment, in the pad opening process (S210), the passive layer 18 which is formed on the connection surface 14a of the electrode pad 14 which is an exposed surface is generated.

Further, in the manufacturing method of the present embodiment, the $N_2$ plasma processing process (S230) corresponds to a process of performing the plasma process of allowing the plasma generated by the gas including nitrogen to irradiate the range which includes the exposed surface of the wiring layer 9 (9a), that is, the connection surface 14a of the electrode pad 14. That is, in the present embodiment, with respect to the gas which generates plasma, the $N_2$ gas is employed as the gas including nitrogen.

In the manufacturing method of the present embodiment, in a similar way to the manufacturing method of the first embodiment, so long as the $N_2$ plasma processing process is after the pad opening process (S210) before the dicing process (S260), the process may be performed at any timing. Here, in a similar way to the above-described manufacturing method of the present embodiment, in a case where the $N_2$ plasma processing process is performed between the pad opening process (S210) and the resist removing process (S220), attention should be paid considering that the resist film 19 may be cured by the plasma processing condition, the wafer state or the like.

According to the above-described manufacturing method of the present embodiment, in a similar way to the first embodiment, it is possible to suppress generation of pad corrosion which causes reduction in the bonding strength on the connection surface 14a of the electrode pad 14, an inferior appearance, or the like. In the case of the present embodiment, the above-described effect is obtained by the following estimation mechanism.

[Estimation Mechanism]

In the solid-state imaging device 1 according to the present embodiment, a different action is obtained by the $N_2$ plasma process in the AlCu front surface section 31 and the Cu front surface section 32 on the front surface of the electrode pad 14.

Specifically, the portion of the AlCu front surface section 31 is not nitride by the irradiation of the $N_2$ plasma. This is based on the fact that the passive layer 18 is formed of aluminum oxide ($Al_2O_3$) on the portion of the AlCu front surface section 31 on the front surface of the electrode pad 14.

That is, as the portion of the AlCu front surface section 31 on which the passive layer 18 which is the high stable layer as described above is formed is covered by the passive layer 18, the portion is not nitrided by the irradiation of the $N_2$ plasma. In this regard, the result that nitrogen is not detected in the portion of the AlCu front surface section 31 is obtained, by an X-ray spectroscopic analysis (XPS).

That is, as Al is mainly combined with oxygen (O) in the portion of the AlCu front surface section 31, the passive layer 18 of aluminum oxide is formed, and Al is not nitrided by the $N_2$ plasma.

Figure 17:
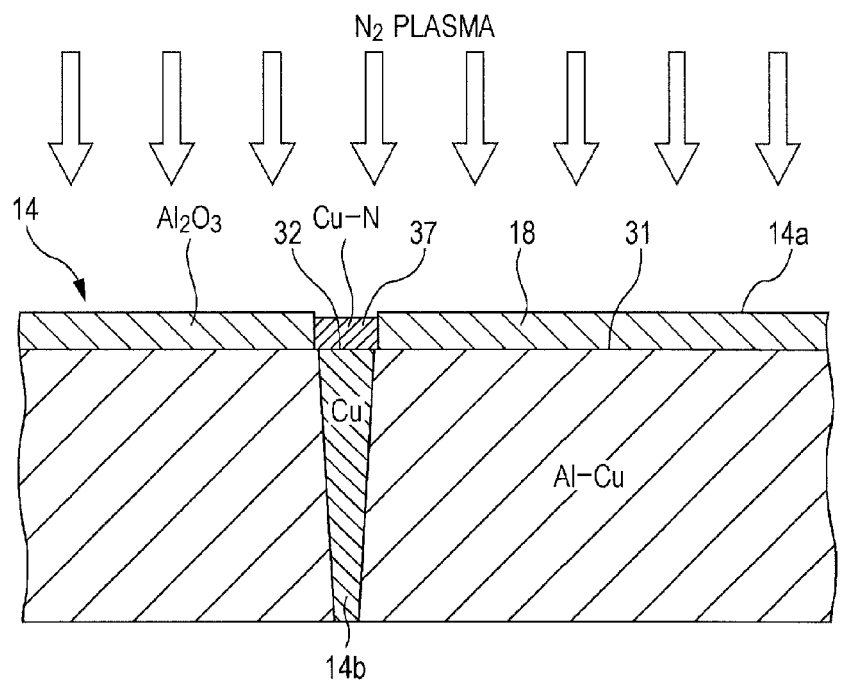
FIG. 17 is a partially enlarged cross-sectional view illustrating a configuration of a solid-state imaging device according to an according to an embodiment of the present disclosure.

On the other hand, as shown in FIG. 17, the portion of the Cu front surface section 32 is nitrided by the irradiation of the $N_2$ plasma, and thus, a Cu—N layer 37 is formed. Cu—N is a chemically stable composition, and thus, the Cu—N layer 37 functions as a blocking layer against the pure water during the dicing process. That is, as the portion of the Cu front surface section 32 is irradiated by the $N_2$ plasma, the Cu—N layer 37 is formed on the Cu front surface section 32, and the AlCu section and the copper section 14b in the electrode pad 14 are blocked from being directly in contact with the pure water by the Cu—N layer 37. Thus, the galvanic effect is not generated on the front surface of the electrode pad 14, and Al is prevented from being eluted. Consequently, it is possible to prevent generation of the pad corrosion on the front surface of the electrode pad 14.

That is, in the manufacturing method of the present embodiment, only the front surface of in the case of the metal having a high standard electrode potential among metals which form the electrode pad 14, that is, Cu (portion of the Cu front surface section 32) in the case of the present embodiment can be selectively nitrided. Thus, since the pad corrosion due to the galvanic effect is prevented, it is possible to maintain the front surface of the pad as a smooth state, and to prevent deterioration of the bonding strength of wire bonding.

In this way, while the front surface of the electrode pad 14 which includes the Cu front surface section 32 and the AlCu front surface section 31 is completely nitrided in the methods of the first embodiment and the second embodiment, in the manufacturing method of the present embodiment, the portion of the Cu front surface section 32 in which the passive layer 18 is not formed is partially nitrided. That is, in the manufacturing method of the present embodiment, as described above, by using the operation in which the sputtering phenomenon is barely generated in the $N_2$ plasma process, by maintaining the passive layer 18 in the portion of the AlCu front surface section 31, and by forming the Cu—N layer 37 in the portion of the Cu front surface section 32, it is possible to prevent the galvanic effect on the front surface of the electrode pad 14. Thus, since pad corrosion due to the galvanic effect is prevented, it is possible to maintain the front surface of the electrode pad 14 as a smooth state, and to prevent deterioration of the bonding strength of wire bonding.

The solid-state imaging device manufactured by the manufacturing method of the present embodiment has the following configuration. That is, the solid-state imaging device of the present embodiment includes the semiconductor substrate 2 (see FIG. 1), the electrode pad 14 which is the wiring layer 9 formed of AlCu which is alloy including two or more types of metals having different standard electrode potentials on one surface side of the semiconductor substrate 2, the nitride layer formed on the front layer of the surface which is irradiated by the $N_2$ plasma of the electrode pad 14 as the electrode pad 14 is irradiated by the $N_2$ plasma, and the passive layer 18 which is formed as the front layer of the electrode pad 14 is passivated. As shown in FIG. 17, the solid-state imaging device of the present embodiment includes the Cu—N layer 37 which is the nitride layer formed on the front layer of the Cu portion having relatively high standard electrode potential among Al and Cu, as the nitride layer.

According to the solid-state imaging device of the present embodiment with such a configuration, as described above, it is possible to suppress pad corrosion and to enhance the bonding strength of wire bonding.

In the above-described embodiment, the connection surface 14a of the electrode pad 14 is used as the exposed surface of the wiring layer 9 which is irradiated by the $N_2$/Ar plasma or the $N_2$ plasma, but any portion which may be in contact with water during the dicing process or the like may be used as the exposed surface of the wiring layer 9.

Further, in the above-described embodiment, the wiring layer 9 (9a) (electrode pad 14) which is irradiated by the $N_2$/Ar plasma or the $N_2$ plasma is formed of AlCu, but as long as it is alloy which includes two or more types of metals having different standard electrode potentials, there is no particular limit. Accordingly, in the present embodiment, as the wiring layer which is irradiated by the plasma, for example, an alloy which includes two or more types of metals selected from metals used as material of the wiring layer in the semiconductor substrate, such as strontium (Sr), magnesium (Mg), scandium (Sc), thorium (Th), beryllium (Be), aluminum (Al), titanium (Ti), zirconium (Zr), manganese (Mn), vanadium (V), tantalum (Ta), zinc (Zn), gallium (Ga), iron (Fe), cadmium (Cd), cobalt (Co), nickel (Ni), molybdenum (Mo), tin (Sn), lead (Pb), ruthenium (Ru), copper (Cu), silver (Ag), palladium (Pd), gold (Au), and the like in the descending order of standard electrode potentials, may be used.

In the present embodiment, as the metal which forms the wiring layer 9 which is irradiated by the $N_2$/Ar plasma or the $N_2$ plasma, alloy (AlCu) which includes aluminum and copper which is more precious (a higher standard electrode potential) than aluminum, among the above-described metals, is employed. The reason why a dissimilar metal is mixed into the main wiring of aluminum is to enhance reliability of wiring. Accordingly, in view of general versatility or the like, the wiring layer 9 which is irradiated by the $N_2$/Ar plasma or the $N_2$ plasma is preferably Al alloy which includes aluminum and a metal which is more precious than aluminum.

Further, in the above-described embodiment, the $N_2$/Ar plasma is employed as the plasma which is generated by the mixture gas of the gas including nitrogen and the inert gas, and the $N_2$ plasma is employed as the plasma which is generated by the gas including nitrogen, but the present disclosure is not limited thereto. The gas including nitrogen includes at least one of nitrogen, ammonia, and nitrogen trifluoride, and the inert gas includes at least one of argon, xenon, helium and neon. Here, since the $N_2$/Ar plasma or the $N_2$ plasma used in the above-described embodiment is generally used in the wafer process, it is effective in view of easy introduction and running costs.

Further, in the above-described embodiment, as a plasma source for generating the plasma, ECR plasma is used, but high density plasma such as inductively coupled plasma (ICP) or capacitively coupled (parallel plate) plasma (CCP) may be used, instead of the ECR plasma. In order to obtain the above-described effect, high density plasma having an ionization state of $10^9$ cm$^{-3}$ or higher is preferably used, for example.

Further, in the plasma process performed in the above-described embodiment, the following processing conditions are appropriately used. In the plasma irradiation, the bias power applied to the wafer is preferably 0 to 2000 W. Further, the pressure of processing atmosphere is preferably 0.1 to 2 Pa. Further, the temperature of processing atmosphere is preferably −30 to 50° C.

As described above, in the present disclosure, considering that the pad corrosion is generated due to the galvanic effect generated as the wiring layer such as an electrode pad 14 which is a predetermined alloy is in contact with water, in a pre-stage in which the wiring layer is in contact with water, the wiring layer is irradiated by plasma such as $N_2$/Ar plasma. Since the galvanic effect is also generated in the portion in which dissimilar metals are in contact with each other, in addition to the alloy which includes metals having different standard electrode potentials such as an electrode pad 14, the plasma irradiation target also includes a contact portion of metals having different standard electrode potentials, in the present disclosure.

Accordingly, in the present disclosure, a manufacturing method may include a predetermined process of generating a contact section (hereinafter, referred to as a "dissimilar metal contact section") in which two or more types of metals having different standard electrode potentials are in contact with each other, on one surface side of the semiconductor substrate 2, and a plasma process of allowing plasma generated by a mixture gas of a gas including nitrogen and an inert gas to irradiate a range which includes the dissimilar metal contact section.

As the predetermined process of generating the dissimilar metal contact section, for example, a process of forming a barrier metal which is formed, for example, to enhance reliability of the wiring layer 9 in the solid-state imaging device 1 is used. A barrier metal 38 is formed in a layer form on the wiring layer 9, that is, between the wiring layer 9 and the interlayer insulation film 8. Thus, in the pre-stage state of the pad opening process in the processes of the manufacturing method of the solid-state imaging device, the barrier metal 38 is present on the front surface of the electrode pad 14 which is formed as a part of the uppermost wiring layer 9a (see FIG. 1).

Figure 18:
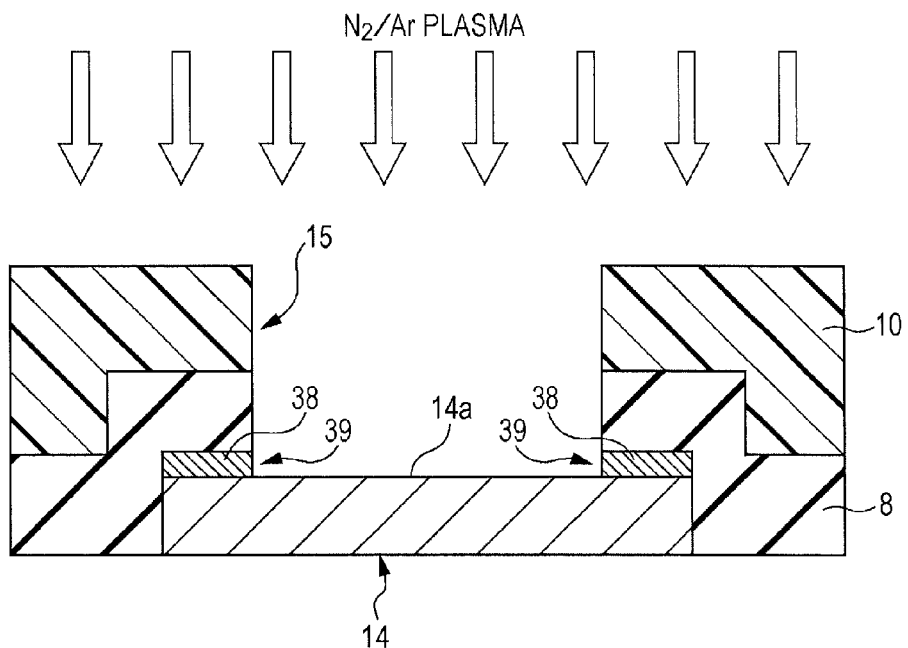
FIG. 18 is a diagram illustrating a manufacturing method according to an embodiment of the present disclosure.

Further, as shown in FIG. 18, as described above, in the pad opening process (for example, S10 in FIG. 5), the barrier metal 38 on the connection surface 14a is removed by a dry etching process for exposing the connection surface 14a of the electrode pad 14. That is, in order to achieve electric connection on the connection surface 14a of the electrode pad 14, the barrier metal 38 on the connection surface 14a is removed.

As shown in FIG. 18, as the barrier metal 38 on the connection surface 14a of the electrode pad 14 is removed, the barrier metal 38 is exposed in a side wall section of the opening section 15, in the opening section 15 which is formed by the dry etching process. In other words, a side surface of the barrier metal 38 which remains after the etching removal faces the opening section 15 as a part of an inner wall surface which forms the opening section 15.

The barrier metal 38 suppresses a so-called electromigration or serves as a barrier function for reaction of a wiring material with a different material. The barrier metal 38 is formed of a high melting point metal such as titanium (Ti), titanium nitride (TiN), tantalum (Ta), tantalum nitride (TaN), tungsten (W), tungsten nitride (WN) or titanium tungsten (TiW), for example.

The barrier metal 38 is formed by a sputtering method, a CVD (Chemical Vapor Deposition) method, an ALD (Atomic Layer Deposition) or the like, for example. Accordingly, in a case where the barrier metal 38 is formed on the electrode pad 14, the process of using the sputtering method or the like which is a process of forming the barrier metal 38 corresponds to the predetermined process of generating the dissimilar metal contact section.

In this way, as the barrier metal 38 is formed on the electrode pad 14, the contact section of the electrode pad 14 and the barrier metal 38 becomes a dissimilar metal contact section 39. The dissimilar metal contact section 39 is exposed by the opening section 15. As the dissimilar metal contact section 39 is in contact with water in the dicing process, metal ions are eluted by the galvanic effect, and thus, the pad corrosion is generated by the above-described mechanism.

That is, in a state where the dissimilar metal contact section 39 is exposed in the opening section 15, if an operation of bringing the dissimilar metal contact section 39 in contact with water, that is, the dicing process is performed, the galvanic effect is generated in the dissimilar metal contact section 39. Thus, the electrode pad 14 (wiring layer 9) which is a coarse metal compared with the metal which forms the barrier metal 38 is dissolved, and in a similar way to the case of the relationship between Al and Cu as described above, the pad corrosion phenomenon is generated.

Specifically, for example, the barrier metal 38 is formed of Ta. In a similar way to Cu, Ta is a metal having a high standard electrode potential compared with Al. Thus, as pure water is in contact with the dissimilar metal contact section 39 of the electrode pad 14 and the barrier metal 38 in the dicing process, an electric potential difference is present between Ta which is a metal having a high standard electrode potential and Al which is a metal having a low standard electrode potential by the galvanic effect. Thus, the Al which is the metal having the low standard electrode potential is dissolved in the pure water as an Al ion by being deprived of electrons. The eluted Al ion 21 reacts with water to become the aluminum hydroxide 22, and is in contact with the silicon scrap 23 generated by the dicing process, to thereby generate the combined product 24 obtained by covering the front surface of the silicon scrap 23 by the aluminum hydroxide 22 (see FIG. 2). Thus, the pad corrosion is generated on the front surface of the electrode pad 14.

Thus, as shown in FIG. 18, in a similar way to the above-describe embodiment, the dissimilar metal contact section 39 which is the contact section of the electrode pad 14 and the barrier metal 38 is irradiated by plasma such as $N_2$ plasma or $N_2$/Ar plasma, thereby making it possible to prevent the galvanic effect in the dissimilar metal contact section 39 by the nitriding action or the like due to the plasma, and to suppress the pad corrosion generated on the front surface of the wiring layer.

As described above, as the plasma irradiation of the $N_2$/Ar plasma or the like, in addition to the alloy portion such as a connection surface 14a of the electrode pad 14 which is the exposed surface of the wiring layer 9, the dissimilar metal contact section such as a contact portion of the electrode pad 14 and the barrier metal 38, in which the galvanic effect is generated, is included. In this way, the plasma process due to the $N_2$/Ar plasma or the like is performed for the dissimilar metal contact section in addition to the alloy portion, and thus, in a similar way to the above-described embodiment, it is possible to suppress the pad corrosion generated on the front surface of the electrode pad 14, which causes reduction in the bonding strength on the connection surface 14a of the electrode pad 14, an inferior appearance, or the like.

[Configuration Example of Electronic Apparatus]

Figure 19:
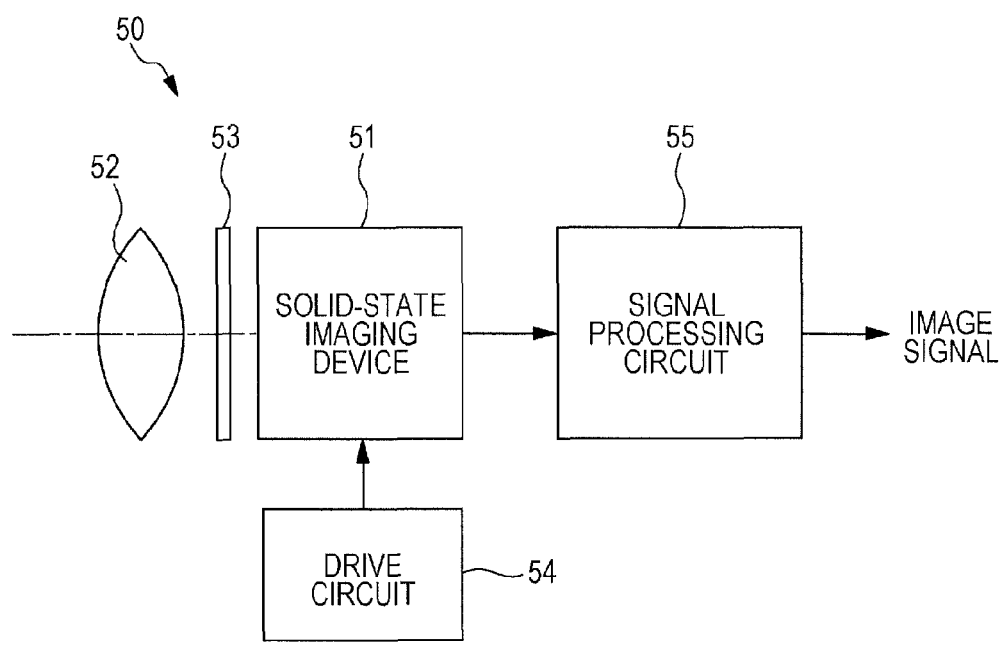
FIG. 19 is a diagram illustrating a configuration of an electronic apparatus according to an embodiment of the present disclosure.

The solid-state imaging device according to the above-described embodiment is applied to a variety of electronic apparatuses such as a digital still camera or a digital video camera which is called a so-called digital camera, or a mobile phone or a different apparatus including an imaging function. Hereinafter, a video camera 50 which is an example of the electronic apparatus including the solid-state imaging device according to the above-described embodiment will be described with reference to FIG. 19.

The video camera 50 performs photographing of a still image or a moving image. The video camera 50 includes a solid-state imaging device 51 according to the above-described embodiment, an optical system 52, a shutter device 53, a drive circuit 54, and a signal processing circuit 55.

The optical system 52 includes an optical lens system including one or plural optical lenses, and guides incident light to a light receiving sensor section of the solid-state imaging device 51. The optical system 52 forms image light (incident light) from an object on an imaging surface of the solid-state imaging device 51. Thus, signal charges are accumulated in the solid-state imaging device 51 for a predetermined time. The shutter device 53 controls a light irradiation period and a light blocking period to the solid-state imaging device 51.

The drive circuit 54 drives the solid-state imaging device 51. The drive circuit 54 generates a drive signal (timing signal) for driving the solid-state imaging device 51 at a predetermined timing, and supplies the signal to the solid-state imaging device 51. By the drive signal supplied to the solid-state imaging device 51 from the drive circuit 54, a transmission operation or the like of a signal electrode of the solid-state imaging device 51 is controlled. That is, the solid-state imaging device 51 performs the transmission operation or the like of signal charges, by the drive signal supplied from the drive circuit 54.

The drive circuit 54 includes a function of generating a variety of pulse signals as the drive signal for driving the solid-state imaging device 51, and a function as a driver which converts the generated pulse signal into a drive pulse for driving the solid-state imaging device 51. The drive circuit 54 also performs generation and supply of the device signal for controlling the operation of the shutter device 53.

The signal processing circuit 55 includes a function of performing a variety of signal processes and processes an output signal of the solid-state imaging device 51. The signal processing circuit 55 processes the input signal to output an image signal. The image signal output from the signal processing circuit 55 is stored in a storage medium such as a memory, or is output to a monitor. The video camera 50 includes a power source such as a battery which supplies power to the drive circuit 54 or the like, a storing section which stores the image signal or the like generated by imaging, a control section which controls the entire apparatus, and the like.

In the video camera 50 with such a configuration, the drive circuit 54 functions as a drive section which generates the drive signal for driving the solid-state imaging device 51. Further, according to the video camera 50 which includes the solid-state imaging device 51 of the present embodiment, it is possible to suppress generation of pad corrosion which is generated as the exposed surface of the wiring layer of the solid-state imaging device 51 is in contact with water in the dicing process or the like and causes reduction in the bonding strength on the exposed surface of the wiring layer, an inferior appearance, or the like.

The present disclosure contains subject matter related to that disclosed in Japanese Priority Patent Application JP 2011-036638 filed in the Japan Patent Office on Feb. 23, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a semiconductor substrate;
a wiring layer which is formed of an alloy including at least a first metal and a second metal having different standard electrode potentials, on one surface side of a semiconductor substrate; and
a nitride layer which is formed on a surface of the wiring layer in a formation area as at least the formation area is irradiated by plasma generated by a mixture gas of a gas including nitrogen and an inert gas or plasma generated by a gas including nitrogen,
wherein, in the formation area, the surface of the wiring layer is divided into two-dimensional regions including first regions and second regions and the nitride layer includes a first type of nitride in contact with the surface of the wiring layer in the first regions and a second type of nitride in contact with the surface of the wiring layer in the second regions.

2. An electronic apparatus comprising:
the semiconductor device according to claim 1; and
a drive section which generates a drive signal for driving the semiconductor device.

3. The semiconductor device according to claim 1,
wherein the first type of nitride contains the first metal and the second type of nitride contains the second metal.

4. The semiconductor device according to claim 3,
wherein the first metal has a higher standard electrode potential than the second metal, and the wiring layer includes local sections of the first metal interspersed throughout the wiring layer,
wherein the first regions correspond to those of the local sections of the first metal that are on the surface of the wiring layer in the formation area and the second regions correspond to the balance of the surface of the wiring layer in the formation area.

5. The semiconductor device according to claim 4,
wherein the first metal is copper and the second metal is aluminum.

6. The semiconductor device according to claim 5,
wherein the formation area corresponds to a contact region configured to connect the semiconductor device to external devices.

7. The semiconductor device according to claim 6, further comprising:
a plurality of pixels formed on the substrate, each including a photoelectric conversion element and a driving circuit;
a readout circuit for reading out signals of the plurality of pixels; and
a passivation film disposed opposite the substrate with the readout circuit therebetween, the passivation film being removed in the contact region.

8. A semiconductor device comprising:
a plurality of pixels formed on a substrate, each including a photoelectric conversion element and a driving circuit;
a readout circuit for reading out signals of the plurality of pixels;
an electrode pad connected to the readout circuit; and
a passivation film disposed on the readout circuit and the electrode pad, a portion of the passivation film being removed so as to expose a portion of the electrode pad corresponding to a contact area, the electrode pad being configured to be connected to external devices via the contact area,
wherein, the electrode pad includes:
a wiring layer formed of an alloy including at least a first metal and a second metal having different standard electrode potentials, and
a nitride layer formed at least on a surface of the wiring layer in the contact area such that, in the contact area, the surface of the wiring layer is divided into two-dimensional regions including first regions and second regions and the nitride layer includes a first type of nitride in contact with the surface of the wiring layer in the first regions and a second type of nitride in contact with the surface of the wiring layer in the second regions.

* * * * *